(12) United States Patent
Shin et al.

(10) Patent No.: US 12,364,015 B2
(45) Date of Patent: Jul. 15, 2025

(54) DISPLAY DEVICE

(71) Applicant: Samsung Display Co., LTD., Yongin-si (KR)

(72) Inventors: Dong Hee Shin, Asan-si (KR); Sun Kwun Son, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 411 days.

(21) Appl. No.: 17/898,187

(22) Filed: Aug. 29, 2022

(65) Prior Publication Data

US 2023/0163138 A1    May 25, 2023

(30) Foreign Application Priority Data

Nov. 25, 2021  (KR) .......................... 10-2021-0164583

(51) Int. Cl.
 *H10D 86/60* (2025.01)
 *H01L 25/16* (2023.01)
 (Continued)

(52) U.S. Cl.
 CPC .......... *H10D 86/60* (2025.01); *H01L 25/167* (2013.01); *H10D 86/441* (2025.01); *G09G 3/3233* (2013.01); *G09G 2300/0426* (2013.01); *G09G 2300/0819* (2013.01); *G09G 2300/0833* (2013.01); *G09G 2310/08* (2013.01); *H01L 24/24* (2013.01); *H01L 24/25* (2013.01);
 (Continued)

(58) Field of Classification Search
 CPC ....... H01L 24/25; H01L 24/24; H01L 25/167;
H10D 86/441; H10D 86/60; G09G 2310/08; G09G 2300/0426; G09G 2300/0833; G09G 2300/0819
See application file for complete search history.

(56) References Cited

U.S. PATENT DOCUMENTS

2008/0290492 A1* 11/2008 Chung .................... H01L 24/24
                                                          257/E23.023
2019/0130848 A1   5/2019 Kim et al.
(Continued)

FOREIGN PATENT DOCUMENTS

KR    10-2013-0120251 A   11/2013
KR    10-2019-0046420 A    5/2019
(Continued)

*Primary Examiner* — Anne M Hines
(74) *Attorney, Agent, or Firm* — Womble Bond Dickinson (US) LLP

(57) ABSTRACT

A display device includes a display panel including a display area having pixels, and a non-display area surrounding the display area, and having a pad portion at one side, the display area including a first sub-display area overlapping the pad portion in a second direction, and a second sub-display area at one side of the first sub-display area, and including a data line, the first sub-display area including a data line, a first gate line on one side of some of the pixels, a first connection line located on one side of others of the pixels, and a second connection line connected to the first connection line, and extending to the second sub-display area in a first direction crossing the second direction, and wherein the data line is electrically connected to the pad portion through the first connection line and the second connection line.

20 Claims, 13 Drawing Sheets

(51) Int. Cl.
  *H10D 86/40*   (2025.01)
  *G09G 3/3233*   (2016.01)
  *H01L 23/00*   (2006.01)

(52) U.S. Cl.
  CPC .............. *H01L 2224/24051* (2013.01); *H01L 2224/24146* (2013.01); *H01L 2224/25175* (2013.01)

(56) References Cited

U.S. PATENT DOCUMENTS

| | | |
|---|---|---|
| 2021/0064162 A1 | 3/2021 | Yin et al. |
| 2021/0201818 A1 | 7/2021 | Jang et al. |
| 2021/0217353 A1* | 7/2021 | Zhao ........................ G09G 3/32 |
| 2021/0247635 A1 | 8/2021 | Shin et al. |
| 2022/0077273 A1 | 3/2022 | Qing et al. |
| 2022/0366856 A1 | 11/2022 | Jang et al. |

FOREIGN PATENT DOCUMENTS

| | | |
|---|---|---|
| KR | 10-2021-0013449 A | 2/2021 |
| KR | 10-2021-0086314 A | 7/2021 |
| KR | 10-2021-0100795 A | 8/2021 |
| WO | WO 2021/098508 A1 | 5/2021 |

\* cited by examiner

MTL1: VDL, CPE2, VIL, DL1
ACTL: DE1, ACT1, SE1, SE2, ACT2, DE2
MTL2: GE1, CPE1, GE2
MTL3: BE1. BE2. BE4

DISPLAY DEVICE

CROSS-REFERENCE TO RELATED APPLICATION

This application claims priority to, and the benefit of, Korean Patent Application No. 10-2021-0164583, filed on Nov. 25, 2021, in the Korean Intellectual Property Office, the contents of which in its entirety are herein incorporated by reference.

BACKGROUND

1. Field

The present disclosure relates to a display device.

2. Description of the Related Art

With the advance of information-oriented society, more and more demands are placed on display devices for displaying images in various ways. For example, display devices are employed in various electronic devices, such as smartphones, digital cameras, laptop computers, navigation devices, and smart televisions. The display device may be a flat panel display device, such as a liquid crystal display device, a field emission display device, and an organic light emitting display device. Among the flat panel display devices, in the light emitting display device, because each of pixels of a display panel includes a light emitting element capable of emitting light by itself, an image can be displayed without a backlight unit for providing light to the display panel. The light emitting element may be an organic light emitting diode using an organic material as a fluorescent material, or an inorganic light emitting diode using an inorganic material as a fluorescent material.

SUMMARY

Aspects of the present disclosure provide a display device capable of including a display driver that functions as both a data driver and a gate driver, and that implements a four-sided frameless design by reducing or minimizing the distance between a pad portion and a display area.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

According to one or more embodiments of the disclosure, a display device includes a display panel including a display area having unit pixels, and a non-display area surrounding the display area in plan view, and having a pad portion at one side of the non-display area, wherein the display area includes a first sub-display area overlapping the pad portion in a second direction, and a second sub-display area at one side of the first sub-display area, and including a data line, wherein the first sub-display area includes a data line connected to the pad portion, and extending in the second direction, a first gate line connected to the pad portion, extending in the second direction, and located on one side of some of the unit pixels, a first connection line connected to the pad portion, extending in the second direction, and located on one side of others of the unit pixels, and a second connection line connected to the first connection line, and extending to the second sub-display area in a first direction crossing the second direction, and wherein the data line is electrically connected to the pad portion through the first connection line and the second connection line.

The first connection line may extend from a first side of the first sub-display area facing the pad portion to a second side of the first sub-display area that is opposite to the first side.

The second sub-display area may further include a dummy scan line extending in the second direction, and located on one side of the unit pixels.

The dummy scan line, the first gate line, and the first connection line may have patterns of a same shape.

The first sub-display area may further include a power line connected to the pad portion, and extending in the second direction, wherein the second sub-display area further includes a power line electrically connected to the pad portion through the first connection line and the second connection line.

The power line of the first sub-display area may include a first voltage line configured to supply a high potential voltage to the unit pixels, an initialization voltage line configured to supply an initialization voltage to the unit pixels, and a vertical voltage line configured to receive a low potential voltage from the pad portion.

The first voltage line may be between the some of the unit pixels and the first gate line.

The first voltage line may be between the some of the unit pixels and the first connection line.

The dummy scan line may be electrically connected to the first voltage line or the vertical voltage line.

Each of the first and second sub-display areas may further include a voltage connection line connected to the power line and extending in the first direction.

The second connection line and the voltage connection line may be on a same imaginary extension line.

The first sub-display area may further include a second gate line connected to the first gate line, and extending to the second sub-display area in the first direction.

Respective contact portions of first gate lines including the first gate line and second gate lines including the second gate line may be on a same extension line extending from a lower end of one side of the first sub-display area to an upper end of another side of the first sub-display area.

According to one or more embodiments of the disclosure, a display device includes a pad portion, a first sub-display area overlapping the pad portion in a second direction, and a second sub-display area on one side of the first sub-display area, wherein the first sub-display area includes a data line connected to the pad portion, and extending in the second direction, a first voltage line connected to the pad portion, and extending in the second direction, a first gate line connected to the pad portion, and located on one side of some of the first voltage lines, a first connection line connected to the pad portion, and located on one side of others of the first voltage lines, and a second connection line connected to the first connection line, and extending to the second sub-display area in a first direction crossing the second direction, and wherein the second sub-display area includes a first voltage line electrically connected to the pad portion through the first connection line and the second connection line, and a dummy scan line on one side of the first voltage line.

The dummy scan line, the first gate line, and the first connection line may have patterns of a same shape.

The second sub-display area may further include a data line electrically connected to the pad portion through another first connection line and another second connection line.

The first sub-display area may further include a second gate line connected to the first gate line, and extending to the second sub-display area in the first direction.

Each of the first and second sub-display areas may further include an auxiliary gate line protruding from the second gate line in the second direction.

The first gate line, the first connection line, and the data line may be in a first metal layer, wherein the auxiliary gate line is in a second metal layer on the first metal layer, and wherein the second gate line and the second connection line are in a third metal layer on the second metal layer.

The first sub-display area may further include a horizontal voltage line connected to the first voltage line, extending in the first direction, and being on a same imaginary extension line as the second connection line.

The display device according to the embodiments may include a display driver that functions as both a data driver and a gate driver, and may electrically connect the pad portion to an area that does not overlap the pad portion through a connection line. Accordingly, the display device may implement a four-sided frameless design by reducing or minimizing the size of the non-display area.

However, the aspects of the present disclosure are not limited to the aforementioned aspects, and various other aspects are included in the present specification.

BRIEF DESCRIPTION OF THE DRAWINGS

The above and other aspects of the present disclosure will become more apparent by describing in detail embodiments thereof with reference to the attached drawings, in which.

DETAILED DESCRIPTION

Figure 1:
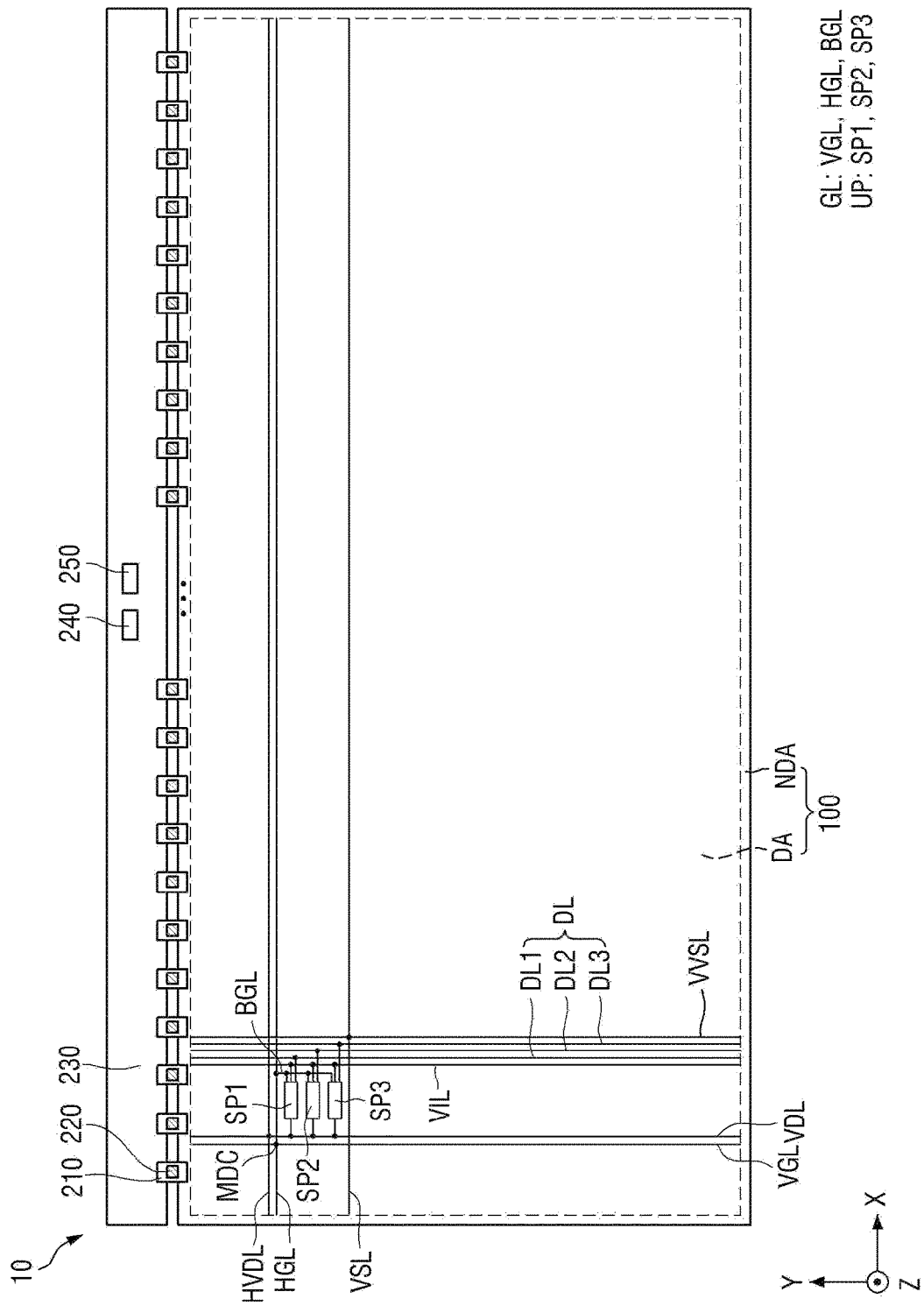
FIG. 1 is a plan view illustrating a display device according to one or more embodiments.

In the following description, for the purposes of explanation, numerous specific details are set forth in order to provide a thorough understanding of various embodiments or implementations of the disclosure. As used herein "embodiments" and "implementations" are interchangeable words that are non-limiting examples of devices or methods employing one or more of the disclosure disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of one or more embodiments may be used or implemented in other embodiments without departing from the disclosure.

Unless otherwise specified, the illustrated embodiments are to be understood as providing features of varying detail of some ways in which the disclosure may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Further, in the accompanying drawings, the size and relative sizes of elements may be exaggerated for clarity and/or descriptive purposes. When one or more embodiments may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

Further, the X-axis, the Y-axis, and the Z-axis are not limited to three axes of a rectangular coordinate system, and thus the X-, Y-, and Z-axes, and may be interpreted in a broader sense. For example, the X-axis, the Y-axis, and the Z-axis may be perpendicular to one another, or may represent different directions that are not perpendicular to one another.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," and the like may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation, not as terms of degree, and thus are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature, and the shapes of these regions may not reflect actual shapes of regions of a device and are not necessarily intended to be limiting.

As customary in the field, some embodiments are described and illustrated in the accompanying drawings in terms of functional blocks, units, parts, and/or modules. Those skilled in the art will appreciate that these blocks, units, parts, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, parts, and/or modules being implemented by microprocessors or other similar hardware, they may be programmed and controlled using software (e.g., microcode) to perform various functions discussed herein and may optionally be driven by firmware and/or software. It is also contemplated that each block, unit, part, and/or module may be implemented by dedicated hardware, or as a combination of dedicated hardware to perform some functions and a processor (e.g., one or more programmed microprocessors and associated circuitry) to perform other functions. Also, each block, unit, part, and/or module of some embodiments may be physically separated into two or more interacting and discrete blocks, units, parts, and/or modules without departing from the scope of the disclosure. Further, the blocks, units, parts, and/or modules of some embodiments may be physically combined into more complex blocks, units, parts, and/or modules without departing from the scope of the disclosure.

Unless otherwise defined or implied herein, all terms (including technical and scientific terms) used herein have the same meaning as commonly understood by one of ordinary skill in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or overly formal sense, unless clearly so defined herein.

Hereinafter, detailed embodiments of the present disclosure will be described with reference to the accompanying drawings.

FIG. 1 is a plan view illustrating a display device according to one or more embodiments.

The terms "above," "top," and "top surface," as used herein, refer to an upward direction (e.g., a Z-axis direction) with respect to the display device. The terms "below," "bottom," and "bottom surface," as used herein, refer to a downward direction (e.g., a direction opposite to the Z-axis direction) with respect to the display device. Further, the terms "left," "right," "upper," and "lower" respectively indicate corresponding directions on the surface of the display device. For example, the term "left" indicates a direction opposite to an X-axis direction, the term "right" indicates the X-axis direction, the term "upper" indicates a Y-axis direction, and the term "lower" indicates a direction opposite to the Y-axis direction.

Referring to FIG. 1, a display device 10, as a device for displaying a moving or still image, may be employed as a display screen of various products, such as a television, a laptop computer, a monitor, a billboard, and an Internet of Things (IoT) device as well as portable electronic devices such as a mobile phone, a smartphone, a tablet personal computer (PC), a smart watch, a watch phone, a mobile communication terminal, an electronic notebook, an eBook reader, a portable multimedia player (PMP), a navigation device, and an ultra-mobile PC (UMPC).

The display device 10 may include a display panel 100, a flexible film 210, a display driver 220, a circuit board 230, a timing controller 240, and a power supply unit 250.

The display panel 100 may have a rectangular shape in plan view. For example, the display panel 100 may have a rectangular shape, in plan view, having long sides in a first direction (X-axis direction), and short sides in a second direction (Y-axis direction). A corner formed by the long side in the first direction (X-axis direction) and the short side in the second direction (Y-axis direction) may be right-angled or rounded with a curvature (e.g., predetermined curvature). The planar shape of the display panel 100 is not limited to the rectangular shape, and may be formed in another polygonal shape, a circular shape, or an elliptical shape. For example, the display panel 100 may be formed to be flat, but is not limited thereto. In another example, the display panel 100 may be bent with a curvature (e.g., predetermined curvature).

The display panel 100 may include a display area DA and a non-display area NDA.

The display area DA, which is an area for displaying an image, may be generally defined as the central area of the display panel 100. The display area DA may include a unit pixel UP, a gate line GL, a data line DL, an initialization voltage line VIL, a first voltage line VDL, a horizontal voltage line HVDL, a vertical voltage line VVSL, and a second voltage line VSL. The unit pixel UP may be formed for each pixel area crossed by a plurality of respective data lines DL and a plurality of respective gate lines GL. The unit pixels UP may include first to third pixels SP1, SP2, and SP3. Each of the first to third pixels SP1, SP2, and SP3 may be connected to one horizontal gate line HGL and one respective data line DL. Each of the first to third pixels SP1, SP2, and SP3 may be defined as a minimum unit area that outputs light.

The first pixel SP1 may emit light of a first color, such as red light, the second pixel SP2 may emit light of a second color, such as green light, and the third pixel SP3 may emit light of a third color, such as blue light. The pixel circuits of the first pixel SP1, the second pixel SP2, and the third pixel SP3 may be arranged in order in the opposite direction of the second direction (Y-axis direction), but the arrangement direction of the pixel circuits is not limited thereto.

The gate line GL may include the vertical gate line VGL, the horizontal gate line HGL, and an auxiliary gate line BGL.

A plurality of vertical gate lines VGL may be connected to a display driver 220 to extend in the second direction (Y-axis direction), and may be spaced apart from each other in the first direction (X-axis direction). The vertical gate line VGL may be a first gate line. The vertical gate lines VGL may be located to be substantially in parallel with the data lines DL. The plurality of horizontal gate lines HGL may extend in the first direction (X-axis direction), and may be spaced apart from each other in the second direction (Y-axis direction). The horizontal gate line HGL may be a second gate line. The plurality of horizontal gate lines HGL may cross the plurality of vertical gate lines VGL. For example, one horizontal gate line HGL may be connected to one of the plurality of vertical gate lines VGL through a contact portion MDC. The contact portion MDC may correspond to a portion in which the horizontal gate line HGL is inserted into the contact hole to contact the vertical gate line VGL. An auxiliary gate line BGL may extend from the horizontal gate line HGL to supply gate signals to first to third pixels SP1, SP2, and SP3.

The plurality of data lines DL may extend in the second direction (Y-axis direction), and may be spaced apart from each other in the first direction (X-axis direction). The plurality of data lines DL may include first to third data lines DL1, DL2, and DL3. Each of the first to third data lines DL1, DL2, and DL3 may supply a data voltage to each of the first to third pixels SP1, SP2, and SP3.

The plurality of initialization voltage lines VIL may extend in the second direction (Y-axis direction), and may be spaced apart from each other in the first direction (X-axis direction). The initialization voltage line VIL may supply the initialization voltage received from the display driver 220 to the pixel circuit of each of the first to third pixels SP1, SP2, and SP3. The initialization voltage line VIL may receive a sensing signal from the pixel circuit of each of the first to third pixels SP1, SP2, and SP3 to supply the sensing signal to the display driver 220.

The plurality of first voltage lines VDL may extend in the second direction (Y-axis direction) and may be spaced apart from each other in the first direction (X-axis direction). The first voltage line VDL may supply a driving voltage or a high potential voltage received from a power supply unit 250 to the first to third pixels SP1, SP2, and SP3.

The plurality of horizontal voltage lines HVDL may extend in the first direction (X-axis direction), and may be spaced apart from each other in the second direction (Y-axis direction). The horizontal voltage line HVDL may be connected to the first voltage line VDL. The horizontal voltage line HVDL may supply a driving voltage or a high potential voltage to the first voltage line VDL.

The vertical voltage lines VVSL may extend in the second direction (Y-axis direction), and may be spaced apart from each other in the first direction (X-axis direction). The vertical voltage line VVSL may be connected to the second voltage line VSL. The vertical voltage line VVSL may supply the low potential voltage received from the power supply unit 250 to the second voltage line VSL.

The second voltage lines VSL may extend in the first direction (X-axis direction), and may be spaced apart from each other in the second direction (Y-axis direction). The second voltage line VSL may supply a low potential voltage to the first to third pixels SP1, SP2, and SP3.

The connection relationship between the unit pixel UP, the gate line GL, the data line DL, the initialization voltage line VIL, the first voltage line VDL, and the second voltage line VSL may be changed in design according to the number and arrangement of the unit pixels UP.

The non-display area NDA may be defined as the remaining area of the display panel 100 that excludes the display area DA. For example, the non-display area NDA may include fan-out lines connecting the vertical gate line VGL, the data line DL, the initialization voltage line VIL, the first voltage line VDL, and the vertical voltage line VVSL to the display driver 220, and may also include a pad portion connected to the flexible film 210.

Input terminals provided on one side of the flexible film 210 may be attached to the circuit board 230 by a film-attaching process, and output terminals provided at the other side of the flexible film 210 may be attached to the pad portion by the film-attaching process. For example, the flexible film 210 may be a flexible film that can be bent, such as a tape carrier package or a chip on film. The flexible film 210 may be bent toward the lower portion of the display panel 100 to reduce the bezel area of the display device 10.

The display driver 220 may be mounted on the flexible film 210. For example, the display driver 220 may be implemented as an integrated circuit (IC). The display driver 220 may receive digital video data and a data control signal from the timing controller 240, and according to the data control signal, may convert the digital video data to an analog data voltage to be supplied to the data lines DL through the fan-out lines. The display driver 220 may generate a gate signal according to a gate control signal supplied from the timing controller 240, and may sequentially supply the gate signal to the plurality of vertical gate lines VGL in a set order. Accordingly, the display driver 220 may function as both a data driver and a gate driver. Because the display device 10 includes the display driver 220 located on the upper side of the non-display area NDA, sizes of the left side, right side, and lower side of the non-display area NDA may be reduced or minimized.

A circuit board 230 may support a timing controller 240 and the power supply unit 250, and may supply signals and power to the display driver 220. For example, the circuit board 230 may supply a signal supplied from the timing controller 240 and a power voltage supplied from the power supply unit 250 to the display driver 220 to display an image on each pixel. To this end, a signal transmission line and a power line may be provided on the circuit board 230.

The timing controller 240 may be mounted on the circuit board 230, and may receive image data and a timing synchronization signal supplied from the display driving system or a graphic device through a user connector provided on the circuit board 230. The timing controller 240 may generate digital video data by arranging the image data to fit the pixel arrangement structure based on the timing synchronization signal, and may supply the generated digital video data to the display driver 220. The timing controller 240 may generate the data control signal and the gate control signal based on the timing synchronization signal. The timing controller 240 may control the data voltage supply timing of the display driver 220 based on the data control signal, and may control the gate signal supply timing of the display driver 220 based on the gate control signal.

The power supply unit 250 may be located on the circuit board 230 to supply a power voltage to the display driver 220 and the display panel 100. For example, the power supply unit 250 may generate a driving voltage or a high potential voltage to supply it to the first voltage line VDL, may generate a low potential voltage to supply it to the vertical voltage line VVSL, and may generate an initialization voltage to supply it to the initialization voltage line VIL.

Figure 2:
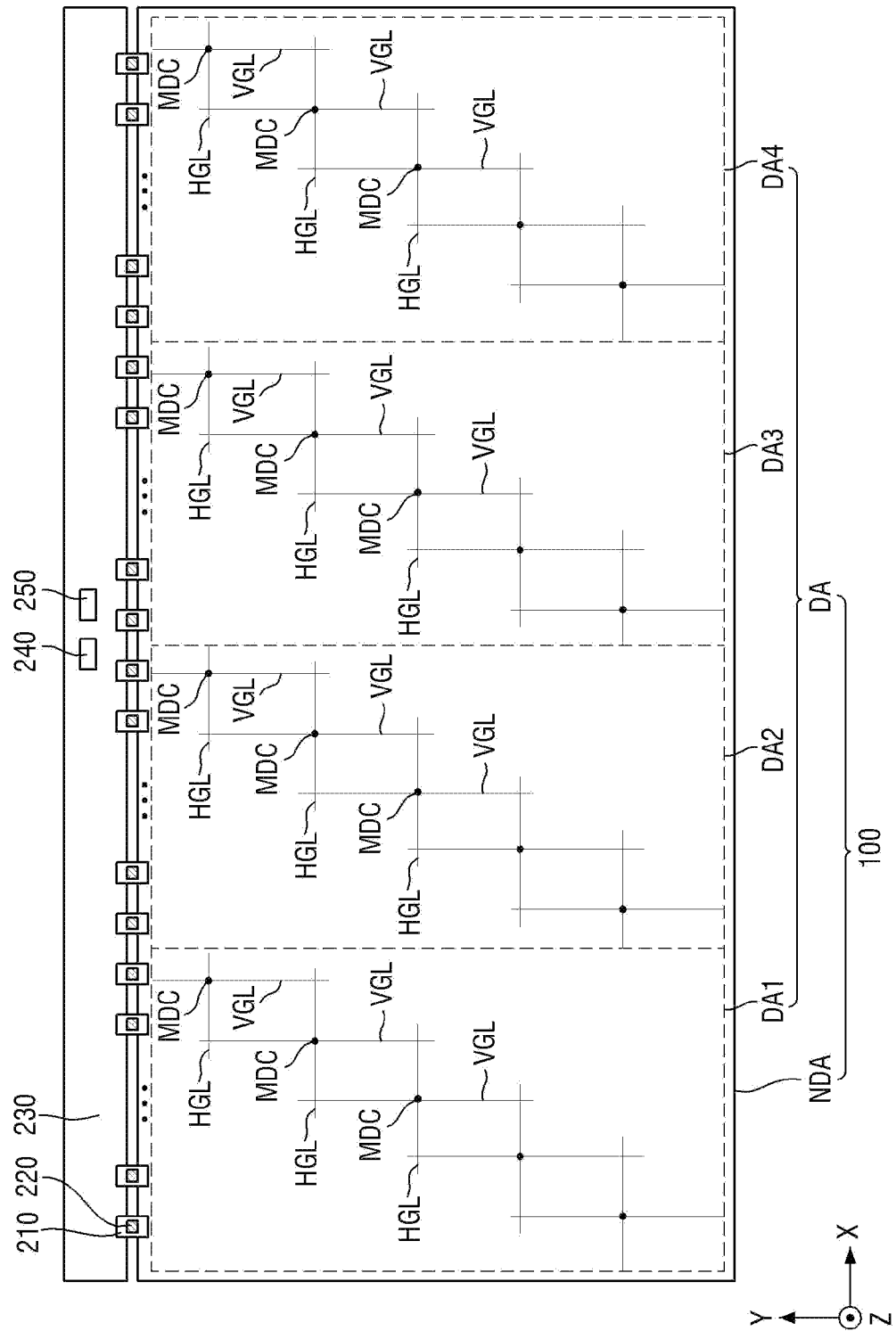
FIG. 2 is a plan view illustrating a contact portion of a vertical gate line and a horizontal gate line in a display device according to one or more embodiments.

FIG. 2 is a plan view illustrating a contact portion of a vertical gate line and a horizontal gate line in a display device according to one or more embodiments.

Referring to FIG. 2, the display area DA may include first to fourth display areas DA1, DA2, DA3, and DA4.

The plurality of horizontal gate lines HGL may cross the plurality of vertical gate lines VGL. For example, one horizontal gate line HGL may be connected to one of the plurality of vertical gate lines VGL through a contact portion MDC, and may be insulated from the other vertical gate lines VGL. Accordingly, the horizontal gate lines HGL and the vertical gate lines VGL may be insulated from each other at crossing points except for respective ones thereof at respective contact portions MDC.

The contact portions MDC of a first display area DA1 may be located on an extension line extending from the upper right end of the first display area DA1 to the lower left end of the first display area DA1. The contact portions MDC of a second display area DA2 may be located on an extension line extending from the upper right end of the second display area DA2 to the lower left end of the second display area DA2. The contact portions MDC of a third display area DA3 may be located on an extension line extending from the upper right end of the third display area DA3 to the lower left end of the third display area DA3. The contact portions MDC of the fourth display area DA4 may be located on an extension line extending from the upper right end of the fourth display area DA4 to the lower left end of the fourth display area DA4. Accordingly, the plurality of contact portions MDC may be respectively arranged along a diagonal direction between the first direction (X-axis direction) and the second direction (Y-axis direction) in each of the first to fourth display areas DA1, DA2, DA3, and DA4.

The display device 10 may include the display driver 220 that functions as a data driver and a gate driver. Accordingly, because the data line DL receives a data voltage from the display driver 220 located on the upper side of the non-display area NDA, and because the vertical gate line VGL receives the gate signal from the display driver 220 located on the upper side of the non-display area NDA, the display device 10 may reduce or minimize the sizes of the left side, right side, and lower side of the non-display area NDA.

Figure 3:
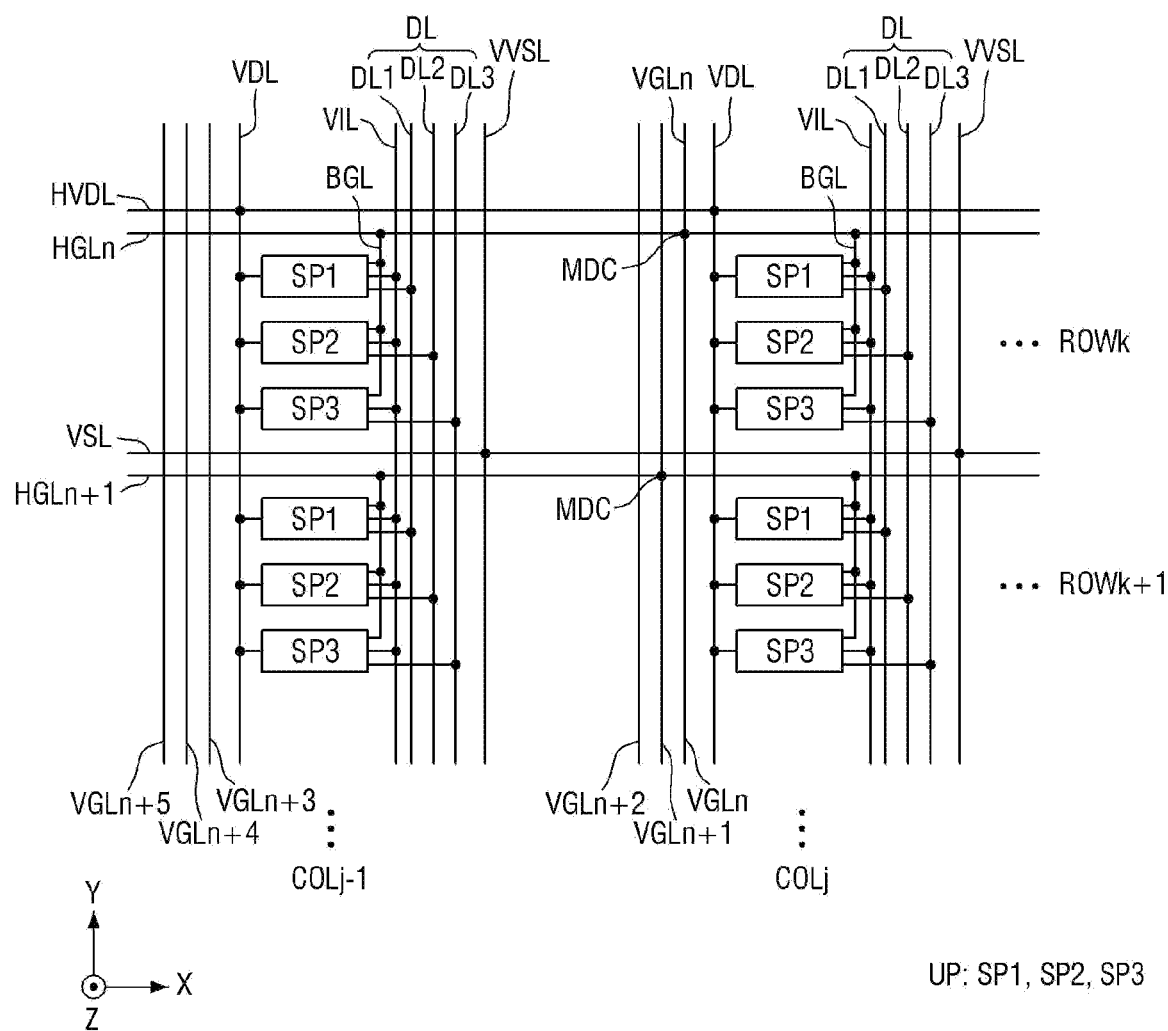
FIG. 3 is a diagram illustrating pixels and lines in a display device according to one or more embodiments.

FIG. 3 is a diagram illustrating pixels and lines in a display device according to one or more embodiments.

Referring to FIG. 3, the unit pixel UP may include first to third pixels SP1, SP2, and SP3. The pixel circuits of the first pixel SP1, the second pixel SP2, and the third pixel SP3 may be arranged (e.g., in order) in the opposite direction (e.g., downwardly) of the second direction (Y-axis direction), but the arrangement direction of the pixel circuits is not limited thereto.

Each of the first to third pixels SP1, SP2, and SP3 may be connected to the first voltage line VDL, the initialization voltage line VIL, the gate line GL, and the data line DL.

A first voltage line VDL may extend in the second direction (Y-axis direction). The first voltage line VDL may be located on one side (e.g., the left side) of the pixel circuits of the first to third pixels SP1, SP2, and SP3. The first voltage line VDL may supply a driving voltage or high potential voltage to a transistor of each of the first to third pixels SP1, SP2, and SP3.

The horizontal voltage line HVDL may extend in the first direction (X-axis direction). The horizontal voltage line HVDL may be located on the upper side of some of the plurality of horizontal gate lines HGL. The horizontal voltage line HVDL may be located on the upper side of the $n^{th}$ horizontal gate line HGLn (n being a positive integer). The horizontal voltage line HVDL may be connected to the first voltage line VDL. The horizontal voltage line HVDL may supply a driving voltage or a high potential voltage to the first voltage line VDL.

The initialization voltage line VIL may extend in the second direction (Y-axis direction). The initialization voltage line VIL may be located on the other side (e.g., the right side) of the auxiliary gate line BGL. The initialization voltage line VIL may be located between the auxiliary gate line BGL and the data line DL. The initialization voltage line VIL may supply an initialization voltage to the pixel circuit of each of the first to third pixels SP1, SP2, and SP3. The initialization voltage line VIL may receive a sensing signal from the pixel circuit of each of the first to third pixels SP1, SP2, and SP3 to supply the sensing signal to the display driver 220.

The gate line GL may include the vertical gate line VGL, the horizontal gate line HGL, and an auxiliary gate line BGL.

The plurality of vertical gate lines VGL may extend in the second direction (Y-axis direction). The vertical gate line VGL may be located between the adjacent unit pixels UP. The vertical gate line VGL may be connected between the display driver 220 and the horizontal gate line HGL. The plurality of vertical gate lines VGL may cross the plurality of horizontal gate lines HGL. The vertical gate line VGL may supply the gate signal received from the display driver 220 to the horizontal gate line HGL.

For example, the $n^{th}$ vertical gate line VGLn (n being a positive integer), the $(n+1)^{th}$ vertical gate line VGLn+1, and the $(n+2)^{th}$ vertical gate line VGLn+2 may be located on one side (e.g., the left side) of the unit pixel UP located in the $j^{th}$ column COLj (j being a positive integer). The plurality of vertical gate lines VGL may be located in parallel between the data line DL connected to the unit pixels UP located on one side, and the first voltage line VDL connected to the unit pixel UP located on the other side. The $n^{th}$, $(n+1)^{th}$, and $(n+2)^{th}$ vertical gate lines VGLn, VGLn+1, and VGLn+2 may be located between the data line DL connected to the unit pixel UP located in the $(j-1)^{th}$ column COLj-1 and the first voltage line VDL connected to the unit pixel UP located in the $j^{th}$ column COLj. The $(n+3)^{th}$ vertical gate line VGLn+3, the $(n+4)^{th}$ vertical gate line VGLn+4, and the $(n+5)^{th}$ vertical gate line VGLn+5 may be located on one side (e.g., the left side) of the unit pixel UP located on the $(j-1)^{th}$ column COLj-1.

The $n^{th}$ vertical gate line VGLn may be connected to the $n^{th}$ horizontal gate line HGLn through the contact portion MDC, and may be insulated from the remaining horizontal gate lines HGL. The $(n+1)^{th}$ vertical gate line VGLn+1 may be connected to the $(n+1)^{th}$ horizontal gate line HGLn+1 through the contact portion MDC, and may be insulated from the remaining horizontal gate lines HGL.

The horizontal gate line HGL may extend in a first direction (X-axis direction). The horizontal gate line HGL may be located on the upper side of the pixel circuit of the first pixel SP1. The horizontal gate line HGL may be connected between the vertical gate line VGL and the auxiliary gate line BGL. The horizontal gate line HGL may supply a gate signal received from the vertical gate line VGL to the auxiliary gate line BGL.

For example, the $n^{th}$ horizontal gate line HGLn may be located on the upper side of the pixel circuit of the first pixel SP1 located in the $k^{th}$ row ROWk (k being a positive integer). The $n^{th}$ horizontal gate line HGLn may be connected to the $n^{th}$ vertical gate line VGLn through the contact portion MDC, and may be insulated from the remaining vertical gate lines VGL. The $(n+1)^{th}$ horizontal gate line HGLn+1 may be located on the upper side of the pixel circuit of the first pixel SP1 located in the $(k+1)^{th}$ row ROWk+1. The $(n+1)^{th}$ horizontal gate line HGLn+1 may be connected to the $(n+1)^{th}$ vertical gate line VGLn+1 through the contact portion MDC, and may be insulated from the remaining vertical gate lines VGL.

The auxiliary gate line BGL may extend from the horizontal gate line HGL in the opposite direction (e.g., downwardly) of the second direction (Y-axis direction). The auxiliary gate line BGL may be located on the right side of the pixel circuits of the first to third pixels SP1, SP2, and SP3. The auxiliary gate line BGL may supply the gate signals received from the horizontal gate line HGL to the pixel circuits of the first to third pixels SP1, SP2, and SP3.

A plurality of data lines DL may extend in the second direction (Y-axis direction). The plurality of data lines DL may supply a data voltage to the first to third pixels SP1, SP2, and SP3. The plurality of data lines DL may include first to third data lines DL1, DL2, and DL3.

The first data line DL1 may extend in the second direction (Y-axis direction). The first data line DL1 may be located on the other side (e.g., the right side) of the initialization voltage line VIL. The first data line DL1 may supply the data voltage received from the display driver 220 to the pixel circuit of the first pixel SP1.

The second data line DL2 may extend in the second direction (Y-axis direction). The second data line DL2 may be located on the other side (e.g., the right side) of the first data line DL1. The second data line DL2 may supply the data voltage received from the display driver 220 to the pixel circuit of the second pixel SP2.

The third data line DL3 may extend in the second direction (Y-axis direction). The third data line DL3 may be located on the other side (e.g., the right side) of the second data line DL2. The third data line DL3 may supply the data voltage received from the display driver 220 to the pixel circuit of the third pixel SP3.

The vertical voltage line VVSL may extend in the second direction (Y-axis direction). The vertical voltage line VVSL may be located on the other side (e.g., the right side) of the third data line DL3. The vertical voltage line VVSL may be connected between the power supply unit 250 and the second voltage line VSL. The vertical voltage line VVSL may supply the low potential voltage supplied from the power supply unit 250 to the second voltage line VSL.

The second voltage line VSL may extend in the first direction (X-axis direction). The second voltage line VSL may be located on the upper side of some others of the plurality of horizontal gate lines HGL. The second voltage line VSL may be located on the upper side of the $(n+1)^{th}$ horizontal gate line HGLn+1. The second voltage line VSL may supply the low potential voltage received from the vertical voltage line VVSL to a light emitting element layer of the first to third pixels SP1, SP2, and SP3.

Figure 4:
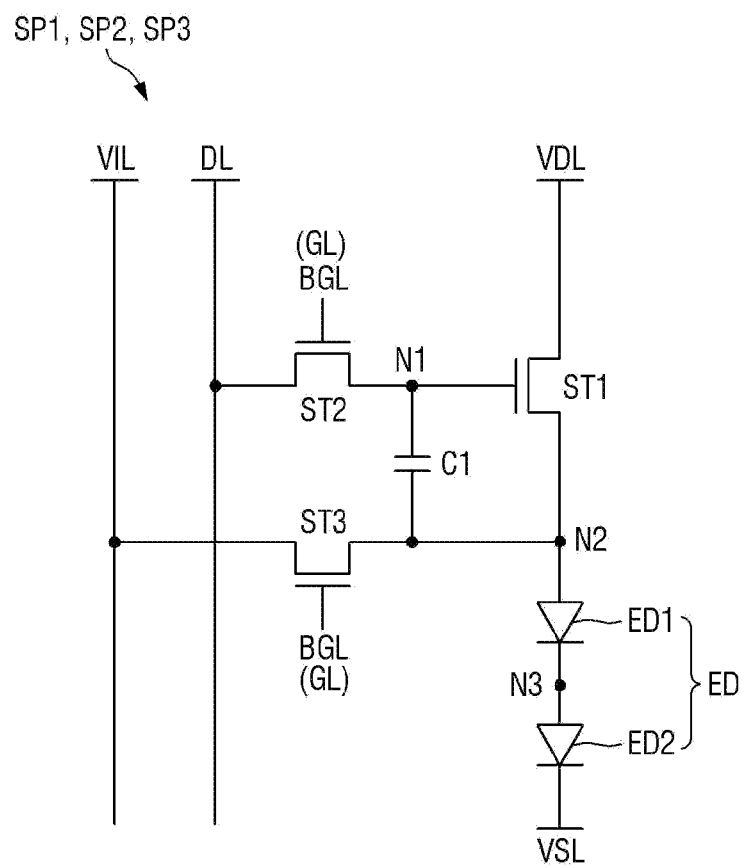
FIG. 4 is a circuit diagram illustrating a pixel of a display device according to one or more embodiments.

FIG. 4 is a circuit diagram illustrating a pixel of a display device according to one or more embodiments.

Referring to FIG. 4, each of the first to third pixels SP1, SP2, and SP3 may be connected to the first voltage line VDL, the data line DL, the initialization voltage line VIL, the auxiliary gate line BGL, and the second voltage line VSL.

Each of the first to third pixels SP1, SP2, and SP3 may include first to third transistors ST1, ST2, and ST3, a first capacitor C1, and a plurality of light emitting elements ED.

The first transistor ST1 may include a gate electrode, a drain electrode, and a source electrode. The gate electrode of the first transistor ST1 may be connected to a first node N1, the drain electrode thereof may be connected to the first voltage line VDL, and the source electrode thereof may be connected to a second node N2. The first transistor ST1 may control a drain-source current (or driving current) based on a data voltage applied to the gate electrode.

The plurality of light emitting elements ED may include a first light emitting element ED1 and a second light emitting element ED2. The first and second light emitting elements ED1 and ED2 may be connected in series. The first and second light emitting elements ED1 and ED2 may receive a driving current to emit light. The light emission amount or the luminance of the light emitting element ED may be proportional to the magnitude of the driving current. For example, the light emitting element ED may be an inorganic light emitting element including an inorganic semiconductor, but is not limited thereto. As another example, the light emitting element ED may be a quantum dot light emitting diode including a quantum dot light emitting layer, an organic light emitting diode including an organic light emitting layer, or an ultra-small light emitting diode. The configuration of the light emitting element layer of the display device 10 may be changed in design according to the type of the light emitting element ED.

The first electrode of the first light emitting element ED1 may be connected to the second node N2, and the second electrode of the first light emitting element ED1 may be connected to a third node N3. The first electrode of the first light emitting element ED1 may be connected to the source electrode of the first transistor ST1, the source electrode of the third transistor ST3, and a second capacitor electrode of the first capacitor C1 through the second node N2. The second electrode of the first light emitting element ED1 may be connected to the first electrode of the second light emitting element ED2 through the third node N3.

The first electrode of the second light emitting element ED2 may be connected to the third node N3, and the second electrode of the second light emitting element ED2 may be connected to the second voltage line VSL. The first electrode of the second light emitting element ED2 may be connected to the second electrode of the first light emitting element ED1 through the third node N3.

The second transistor ST2 may be turned on by the gate signal of the gate line GL or the auxiliary gate line BGL to connect the data line DL to the first node N1, which is the gate electrode of the first transistor ST1. The second transistor ST2 may be turned on according to the gate signal to thereby supply the data voltage to the first node N1. The gate electrode of the second transistor ST2 may be connected to the auxiliary gate line BGL, the drain electrode thereof may be connected to the data line DL, and the source electrode thereof may be connected to the first node N1. The source electrode of the second transistor ST2 may be connected to the gate electrode of the first transistor ST1 and to a first capacitor electrode of the first capacitor C1 through the first node N1.

The third transistor ST3 may be turned on by the gate signal of the auxiliary gate line BGL or the gate line GL to connect the initialization voltage line VIL to the second node N2, which is the source electrode of the first transistor ST1. The third transistor ST3 may be turned on according to the gate signal to supply the initialization voltage to the second node N2. The gate electrode of the third transistor ST3 may be connected to the auxiliary gate line BGL, the drain electrode thereof may be connected to the initialization voltage line VIL, and the source electrode thereof may be connected to the second node N2. The source electrode of the third transistor ST3 may be connected to the source electrode of the first transistor ST1, the second capacitor electrode of the first capacitor C1, and the first electrode of the first light emitting element ED1 through the second node N2.

Figure 5:
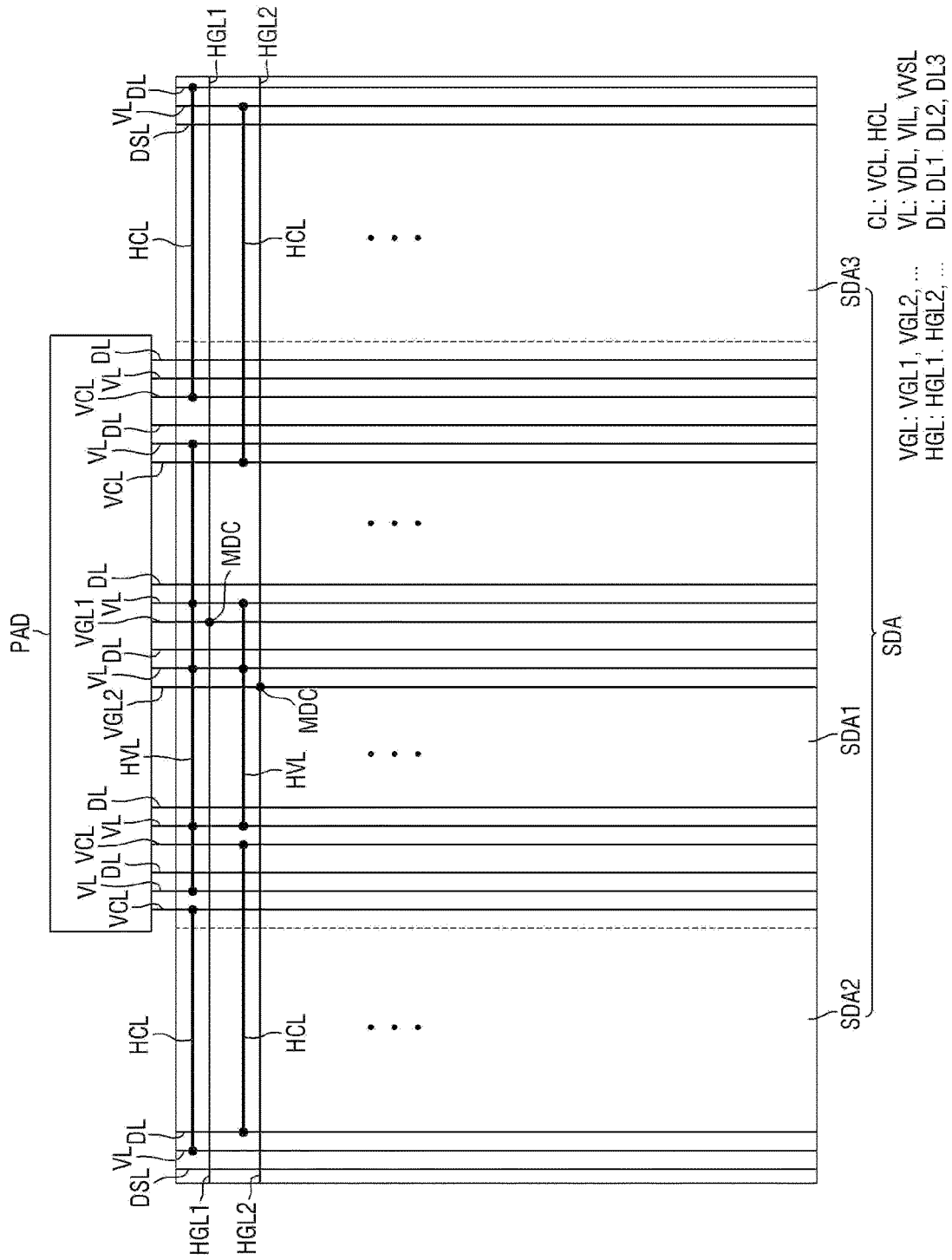
FIG. 5 is a plan view illustrating a connection relationship between a pad portion and lines in a display device according to one or more embodiments.

FIG. 5 is a plan view illustrating a connection relationship between a pad portion and lines in a display device according to one or more embodiments.

Referring to FIG. 5, the plurality of pad portions PAD may be located on the upper side of the non-display area NDA of the display panel 100. The display panel 100 may be connected to the plurality of flexible films 210 through the plurality of pad portions PAD. One pad portion PAD may correspond to one flexible film 210. The display area DA may include a plurality of sub-display areas SDA, and one sub-display area SDA may correspond to one pad portion PAD. Accordingly, the first to third pixels SP1, SP2, and SP3 located in one sub-display area SDA may be electrically connected to one pad portion PAD.

The sub-display area SDA may include first to third sub-display areas SDA1, SDA2, and SDA3. The first sub-display area SDA1 may overlap the pad portion PAD in the second direction (Y-axis direction). The power line VL, the data line DL, the vertical gate line VGL, and a vertical connection line VCL that are connected to the pad portion PAD may extend in the second direction (Y-axis direction) in the first sub-display area SDA1. Here, the power line VL may include the first voltage line VDL, the initialization voltage line VIL, and the vertical voltage line VVSL. The plurality of power lines VL of the first sub-display area SDA1 may be electrically connected through a voltage connection line HVL extending in the first direction (X-axis direction).

The power line VL and the data line DL located in the first sub-display area SDA1 may be connected to the unit pixels UP of the first sub-display area SDA1. The vertical gate line VGL may be connected to the corresponding horizontal gate line HGL in the first sub-display area SDA1. For example, the first vertical gate line VGL1 may be connected to the first horizontal gate line HGL1 through the contact portion MDC, and the second vertical gate line VGL2 may be connected to the second horizontal gate line HGL2 through the contact portion MDC. Accordingly, the plurality of contact portions MDC may be located in the first sub-display area SDA1, and might not be located in the second and third sub-display areas SDA2 and SDA3.

The connection line CL may include the vertical connection line VCL and a horizontal connection line HCL. The vertical connection line VCL may be a first connection line, and the horizontal connection line HCL may be a second connection line. The vertical connection line VCL may extend from the pad portion PAD to the lower side of the first sub-display area SDA1. The vertical connection line VCL may be formed of the same material as, and on the same layer as, the power line VL, the data line DL, and the vertical gate line VGL, but is not limited thereto. The horizontal connection line HCL may be connected to the vertical connection line VCL in the first sub-display area SDA1, and may extend to the second sub-display area SDA2 or the third sub-display area SDA3. The horizontal connection line HCL may be formed of the same material as, and on the same layer as, the voltage connection line HVL and the horizontal gate line HGL, but is not limited thereto. For example, the horizontal connection line HCL and the voltage connection line HVL located on the upper side of the first horizontal gate line HGL1 may be located on an imaginary extension line, but are not limited thereto.

The second sub-display area SDA2 may be located on one side (e.g., the left side) of the first sub-display area SDA1. The second sub-display area SDA2 may not overlap the pad portion PAD in the second direction (Y-axis direction). The power line VL and the data line DL of the second sub-display area SDA2 may not be directly connected to the pad portion PAD. The power line VL and the data line DL of the second sub-display area SDA2 may be electrically connected to the pad portion PAD through the connection line CL passing through the first sub-display area SDA1. Each of the power line VL and the data line DL of the second sub-display area SDA2 may be electrically connected to the pad portion PAD through the vertical connection line VCL extending from the pad portion PAD to the first sub-display area SDA1, and to the horizontal connection line HCL extending from the first sub-display area SDA1 to the second sub-display area SDA2. Accordingly, the display panel 100 may omit a fan-out line directly connecting the pad portion PAD and the second sub-display area SDA2, and may reduce or minimize the distance between the pad portion PAD and the sub-display area SDA.

The third sub-display area SDA3 may be located on the other side (e.g., the right side) of the first sub-display area SDA1. The third sub-display area SDA3 may not overlap the pad portion PAD in the second direction (Y-axis direction). The power line VL and the data line DL of the third sub-display area SDA3 might not be directly connected to the pad portion PAD. The power line VL and the data line DL of the third sub-display area SDA3 may be electrically connected to the pad portion PAD through the connection line CL passing through the first sub-display area SDA1. Each of the power line VL and the data line DL of the third sub-display area SDA3 may be electrically connected to the pad portion PAD through the vertical connection line VCL extending from the pad portion PAD to the first sub-display area SDA1 and the horizontal connection line HCL extending from the first sub-display area SDA1 to the third sub-display area SDA3. Accordingly, the display panel 100 may omit a fan-out line directly connecting the pad portion PAD to the third sub-display area SDA3, and may reduce or minimize the distance between the pad portion PAD and the sub-display area SDA.

Because the display panel 100 includes the display driver 220 that functions as both a data driver and a gate driver, the size of the left side, right side, and lower side of the non-display area NDA may be reduced or minimized. The display panel 100 may reduce or minimize the size of the upper side of the non-display area NDA by electrically connecting the pad portion PAD to the second or third sub-display area SDA2 or SDA3 through the connection line CL passing through the first sub-display area SDA1. As a result, the display panel 100 may implement a four-sided frameless design by reducing or minimizing the sizes of the upper side, lower side, left side, and right side of the non-display area NDA.

Figure 6:
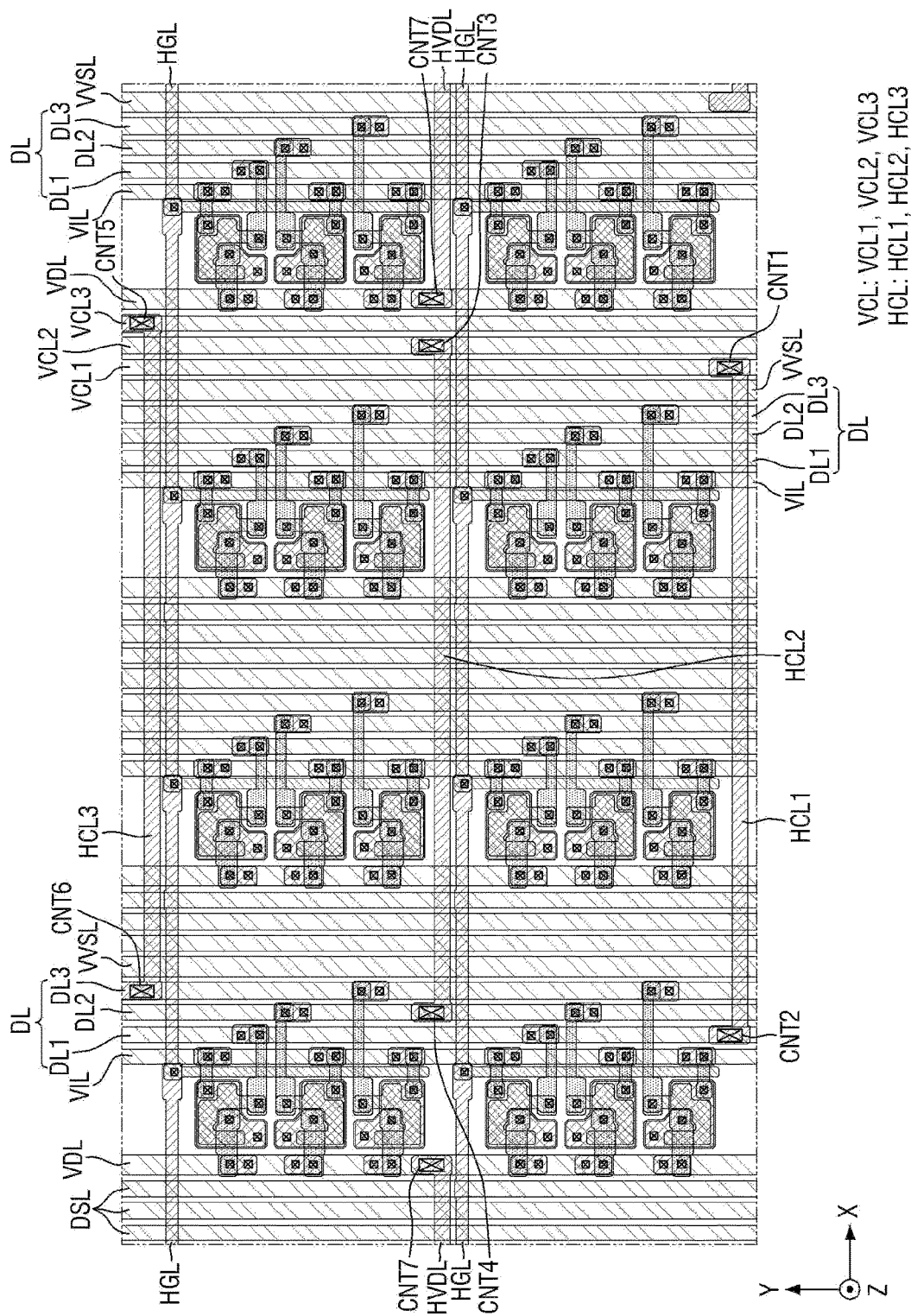
FIG. 6 is a plan view illustrating a portion of a display area in a display device according to one or more embodiments.

FIG. 6 is a plan view illustrating a portion of a display area in a display device according to one or more embodiments.

Referring to FIG. 6, the display area DA may include the unit pixel UP, the vertical connection line VCL, a dummy scan line DSL, the first voltage line VDL, the initialization voltage line VIL, the data line DL, the vertical voltage line VVSL, the auxiliary gate line BGL, the horizontal gate line HGL, the horizontal connection line HCL, and the horizontal voltage line HVDL. The first voltage line VDL, the initialization voltage line VIL, and the vertical voltage line VVSL may correspond to the power line VL illustrated in FIG. 5. The horizontal voltage line HVDL may correspond to the voltage connection line HVL illustrated in FIG. 5.

The vertical connection line VCL may be located in the first metal layer to extend in the second direction (Y-axis direction). The first metal layer may be a metal pattern located on the substrate. The vertical connection line VCL may extend from the pad portion PAD to the lower side of the first sub-display area SDA1. The vertical connection line VCL may be formed of the same material as, and on the same layer as, the dummy scan line DSL, the first voltage line VDL, the initialization voltage line VIL, the data line DL, and the vertical voltage line VVSL, but is not limited thereto. The vertical connection line VCL may include the first to third vertical connection lines VCL1, VCL2, and VCL3 extending in parallel from one side of one unit pixel UP. The first to third vertical connection lines VCL1, VCL2, and VCL3 may be located between the vertical voltage line VVSL and the first voltage line VDL. The first vertical connection line VCL1 may be connected to a first horizontal connection line HCL1 through a first contact hole CNT1. The second vertical connection line VCL2 may be connected to a second horizontal connection line HCL2 through a third contact hole CNT3. The third vertical connection line VCL3 may be connected to a third horizontal connection line HCL3 through a fifth contact hole CNT5.

The dummy scan line DSL may be located in the first metal layer to extend in the second direction (Y-axis direction). The dummy scan line DSL may be located on one side (e.g., the left side) of the first voltage line VDL in the second and third sub-display areas SDA2 and SDA3. The dummy scan line DSL may be electrically connected to the first voltage line VDL or the vertical voltage line VVSL, but is not limited thereto.

The dummy scan line DSL, the vertical gate line VGL, and the vertical connection line VCL may have patterns of the same shape in the first metal layer, but is not limited thereto. Here, the patterns of the same shape mean that the length, thickness, or bending shape is the same. For example, among the patterns of the first metal layer located on one side (e.g., the left side) of the first voltage line VDL in the first sub-display area SDA1, a pattern connected to the horizontal gate line HGL may correspond to the vertical gate line VGL. Among the patterns of the first metal layer located on one side (e.g., the left side) of the first voltage line VDL in the first sub-display area SDA1, a pattern connected to the horizontal connection line HCL may correspond to the vertical connection line VCL. The pattern of the first metal layer located on one side (e.g., the left side) of the first voltage line VDL in the second sub-display area SDA2 may correspond to the dummy scan line DSL.

The dummy scan line DSL, the vertical gate line VGL, and the vertical connection line VCL may be periodically located on a plane. The dummy scan line DSL, the vertical gate line VGL, and the vertical connection line VCL may be located on one side (e.g., the left side) of the first voltage line VDL in a plurality of groups. For example, the three dummy scan lines DSL may be located on one side (e.g., the left side) of the first voltage line VDL. The three vertical gate lines VGL may be located on one side (e.g., the left side) of the first voltage line VDL. The three vertical connection lines VCL may be located on one side (e.g., the left side) of the first voltage line VDL. Accordingly, when the first voltage line VDL is periodically arranged, the dummy scan line DSL, the vertical gate line VGL, and the vertical connection line VCL may be periodically arranged.

The auxiliary gate line BGL may be located in the second metal layer to extend in the second direction (Y-axis direction). The second metal layer may be a metal pattern located on the first metal layer. The auxiliary gate line BGL may supply gate signals received from the vertical gate line VGL and the horizontal gate line HGL to the first to third pixels SP1, SP2, and SP3.

The horizontal connection line HCL may be located in the third metal layer to extend in the first direction (X-axis direction). The third metal layer may be a metal pattern located on the second metal layer. The horizontal connection line HCL may extend from the first sub-display area SDA1 to the second or third sub-display area SDA2 or SDA3. The horizontal connection line HCL may be formed of the same material as, and on the same layer as, the horizontal gate line HGL and the horizontal voltage line HVDL, but is not limited thereto. The horizontal connection line HCL may include the first to third horizontal connection lines HCL1, HCL2, and HCL3 connected to each of the first to third vertical connection lines VCL1, VCL2, and VCL3. Each of the first to third horizontal connection lines HCL1, HCL2, and HCL3 may be located on the upper side of the horizontal gate line HGL. The first horizontal connection line HCL1 may be connected to the first data line DL1 through the second contact hole CNT2. The second horizontal connection line HCL2 may be connected to the second data line DL2 through a fourth contact hole CNT4. The third horizontal connection line HCL3 may be connected to the third data line DL3 through a sixth contact hole CNT6.

The power line VL and the data line DL located in each of the second and third sub-display area SDA2 and SDA3 may be electrically connected to the pad portion PAD through the connection line CL passing through the first sub-display area SDA1. The first data line DL1 may be electrically connected to the pad portion PAD through the first vertical connection line VCL1 and the first horizontal connection line HCL1. The second data line DL2 may be electrically connected to the pad portion PAD through the second vertical connection line VCL2 and the second horizontal connection line HCL2. The third data line DL3 may be electrically connected to the pad portion PAD through the third vertical connection line VCL3 and the third horizontal connection line HCL3. Accordingly, the display panel 100 may omit a fan-out line directly connecting the pad portion PAD to the second or third sub-display area SDA2 or SDA3, and may reduce or minimize the distance between the pad portion PAD and the sub-display area SDA.

The horizontal voltage line HVDL may be located in the third metal layer to extend in the first direction (X-axis direction). The horizontal voltage line HVDL may be located on the upper side of the horizontal gate line HGL. The horizontal voltage line HVDL may be connected to the first voltage line VDL through a seventh contact hole CNT7. The horizontal voltage line HVDL and the horizontal connection line HCL may be located on an imaginary extension line, but are not limited thereto.

Figure 7:
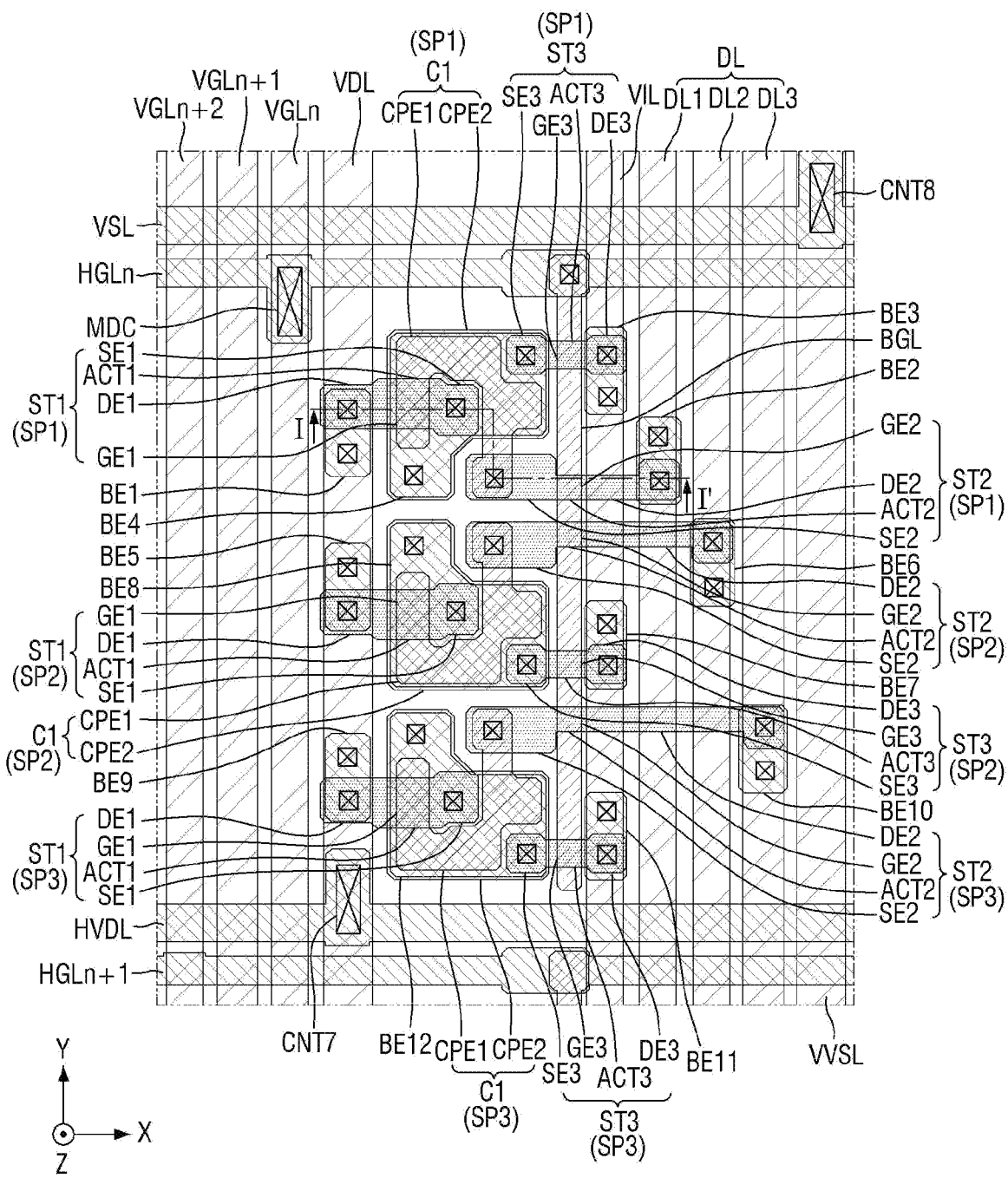
FIGS. 7 and 8 are plan views illustrating unit pixels adjacent to a vertical gate line in a display device according to one or more embodiments.
Figure 8:
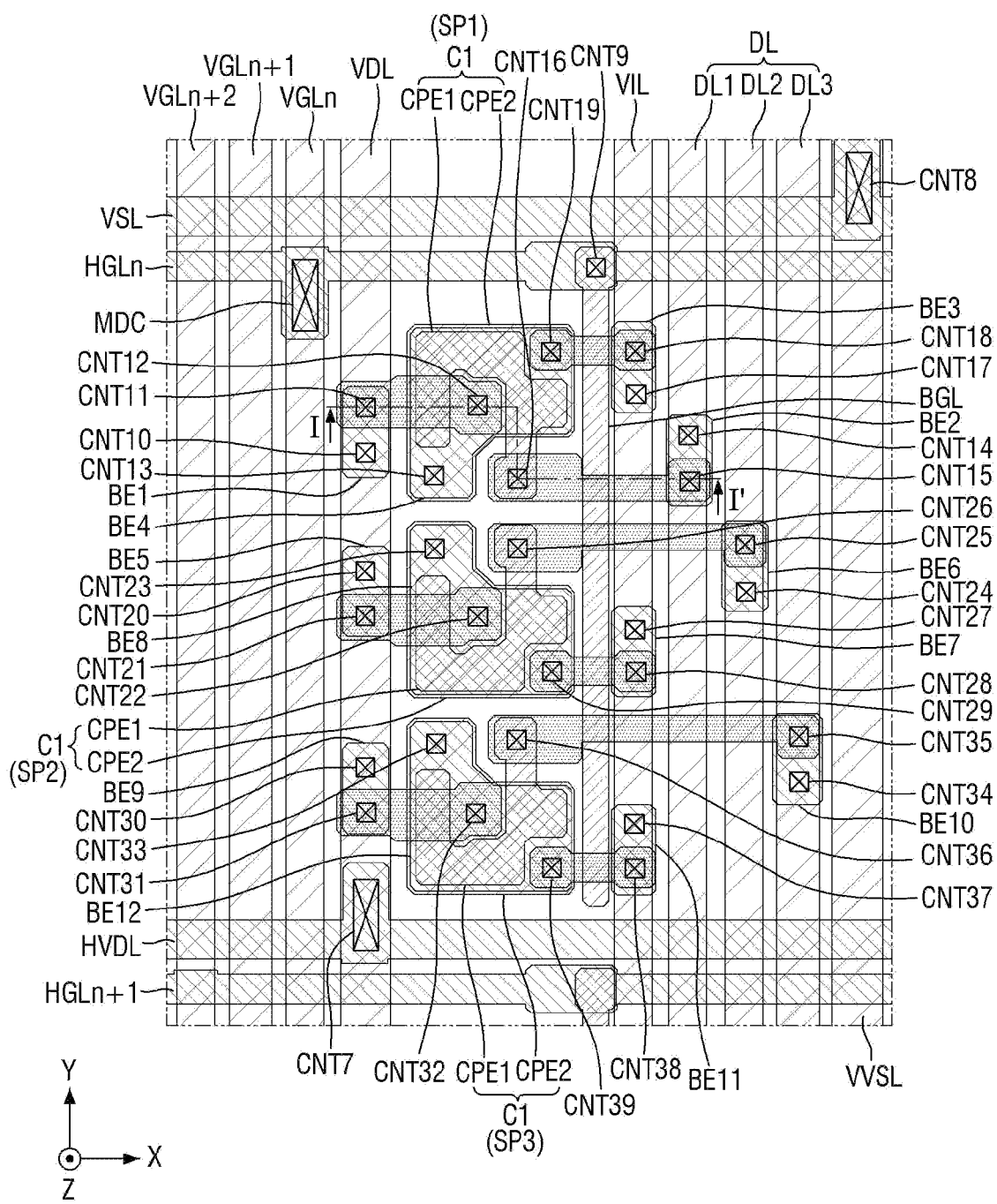
Figure 9:
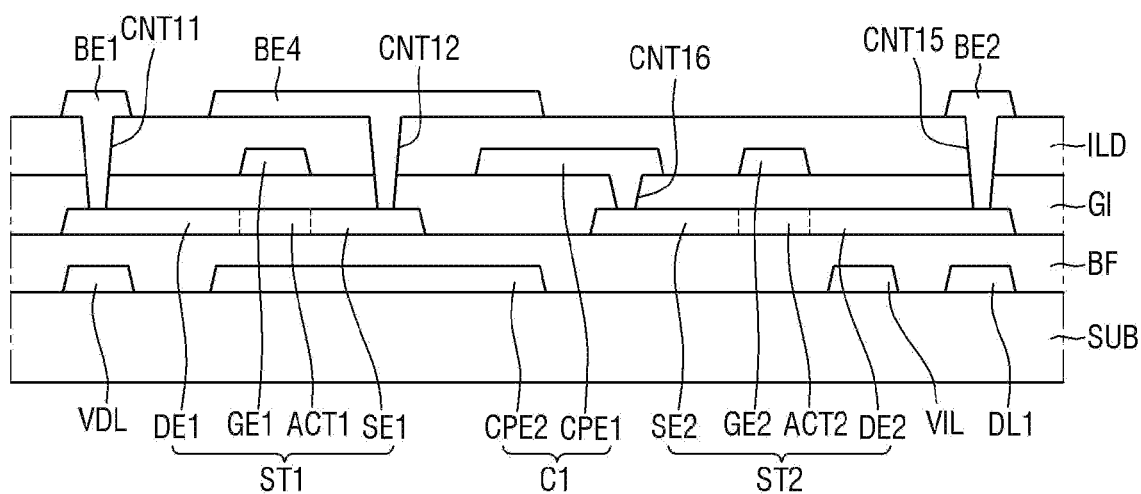
FIG. 9 is a cross-sectional view taken along the line I-I' of FIGS. 7 and 8.

FIGS. 7 and 8 are plan views illustrating unit pixels adjacent to a vertical gate line in a display device according to one or more embodiments. FIGS. 7 and 8 illustrate by dividing the reference numerals of the same view. The unit pixel UP of FIGS. 7 and 8 may be located in the first sub-display area SDA1. FIG. 9 is a cross-sectional view taken along the line I-I' of FIGS. 7 and 8.

Referring to FIGS. 7 to 9, the display area DA may include the unit pixel UP, the first voltage line VDL, the horizontal voltage line HVDL, the vertical gate line VGL, the horizontal gate line HGL, the auxiliary gate line BGL, the initialization voltage line VIL, the data line DL, the vertical voltage line VVSL, and the second voltage line VSL. The unit pixels UP may include first to third pixels SP1, SP2, and SP3. The pixel circuit of the first pixel SP1, the pixel circuit of the second pixel SP2, and the pixel circuit of the third pixel SP3 may be arranged in the opposite direction of the second direction (Y-axis direction).

The first voltage line VDL may be located in a first metal layer MTL1 on the substrate SUB. The first voltage line VDL may be located on one side (e.g., the left side) of the pixel circuits of the first to third pixels SP1, SP2, and SP3. The first voltage line VDL may be connected to a first connection electrode BE1 of a third metal layer MTL3 through a tenth contact hole CNT10, and the first connection electrode BE1 may be connected to a drain electrode DE1 of the first transistor ST1 of the first pixel SP1 through an eleventh contact hole CNT11. The first voltage line VDL may be connected to a fifth connection electrode BE5 of the third metal layer MTL3 through a twentieth contact hole CNT20, and the fifth connection electrode BE5 may be connected to the drain electrode DE1 of the first transistor ST1 of the second pixel SP2 through a twenty-first contact hole CNT21. The first voltage line VDL may be connected to a ninth connection electrode BE9 of the third metal layer MTL3 through a thirtieth contact hole CNT30, and the ninth connection electrode BE9 may be connected to the drain electrode DE1 of the first transistor ST1 of the third pixel SP3 through a thirty-first contact hole CNT31.

The horizontal voltage line HVDL may be located in the third metal layer MTL3. The third metal layer MTL3 may be located on an interlayer insulating layer ILD covering a second metal layer MTL2. The horizontal voltage line HVDL may be located on the upper side of some of the plurality of horizontal gate lines HGL. The horizontal voltage line HVDL may be connected to the plurality of first voltage lines VDL through the seventh contact hole CNT7 to receive a driving voltage. The horizontal voltage line HVDL may stably maintain the driving voltage or the high potential voltage of the plurality of first voltage lines VDL.

The vertical gate line VGL may be located in the first metal layer MTL1. The vertical gate line VGL may include the $n^{th}$ vertical gate line VGLn, the $(n+1)^{th}$ vertical gate line VGLn+1, and the $(n+2)^{th}$ vertical gate line VGLn+2 located on one side (e.g., the left side) of the first voltage line VDL. The $n^{th}$ vertical gate line VGLn may be connected to the $n^{th}$ horizontal gate line HGLn through the contact portion MDC, and may be insulated from the remaining horizontal gate lines HGL.

The horizontal gate line HGL may be located in the third metal layer MTL3. The horizontal gate line HGL may be located on the upper side of the pixel circuit of the first pixel SP1. The $n^{th}$ horizontal gate line HGLn may be connected to the $n^{th}$ vertical gate line VGLn through the contact portion MDC. The $n^{th}$ horizontal gate line HGLn may be connected to the auxiliary gate line BGL through a ninth contact hole CNT9. The $n^{th}$ horizontal gate line HGLn may supply a gate signal received from the $n^{th}$ vertical gate line VGLn to the auxiliary gate line BGL.

The auxiliary gate line BGL may be located in the second metal layer MTL2. The second metal layer MTL2 may be located on a gate insulating layer GI covering an active layer ACTL. The auxiliary gate line BGL may extend from the horizontal gate line HGL in the opposite direction of the second direction (Y-axis direction). The auxiliary gate line BGL may be located on the other side (e.g., the right side) of the pixel circuits of the first to third pixels SP1, SP2, and SP3. The auxiliary gate line BGL may supply the gate signals received from the horizontal gate line HGL to the first to third pixels SP1, SP2, and SP3.

The initialization voltage line VIL may be located in the first metal layer MTL1. The initialization voltage line VIL may be located on the other side (e.g., the right side) of the auxiliary gate line BGL. The initialization voltage line VIL may be connected to a third connection electrode BE3 of the third metal layer MTL3 through a seventeenth contact hole CNT17, and the third connection electrode BE3 may be connected to a drain electrode DE3 of the third transistor ST3 of the first pixel SP1 through the eighteenth contact hole CNT18. The initialization voltage line VIL may be connected to a seventh connection electrode BE7 of the third metal layer MTL3 through a twenty-seventh contact hole CNT27, and the seventh connection electrode BE7 may be connected to the drain electrode DE3 of the third transistor ST3 of the second pixel SP2 through a twenty-eighth contact hole CNT28. The initialization voltage line VIL may be connected to an eleventh connection electrode BE11 of the third metal layer MTL3 through a thirty-seventh contact hole CNT37, and the eleventh connection electrode BE11 may be connected to the drain electrode DE3 of the third transistor ST3 of the third pixel SP3 through a thirty-eighth contact hole CNT38. Accordingly, the initialization voltage line VIL may supply the initialization voltage to the third transistor ST3 of each of the first to third pixels SP1, SP2, and SP3, and may receive the sensing signal from the third transistor ST3.

The first data line DL1 may be located in the first metal layer MTL1. The first data line DL1 may be located on the other side (e.g., the right side) of the initialization voltage line VIL. The first data line DL1 may be connected to a second connection electrode BE2 of the third metal layer MTL3 through a fourteenth contact hole CNT14, and the second connection electrode BE2 may be connected to the drain electrode DE2 of the second transistor ST2 of the first pixel SP1 through a fifteenth contact hole CNT15. The first data line DL1 may supply a data voltage to the second transistor ST2 of the first pixel SP1.

The second data line DL2 may be located in the first metal layer MTL1. The second data line DL2 may be located on the other side (e.g., the right side) of the first data line DL1. The second data line DL2 may be connected to a sixth connection electrode BE6 of the third metal layer MTL3 through a twenty-fourth contact hole CNT24, and the sixth connection electrode BE6 may be connected to the drain electrode DE2 of the second transistor ST2 of the second pixel SP2 through a twenty-fifth contact hole CNT25. The second data line DL2 may supply a data voltage to the second transistor ST2 of the second pixel SP2.

The third data line DL3 may be located in the first metal layer MTL1. The third data line DL3 may be located on the other side (e.g., the right side) of the second gate line DL2. The third data line DL3 may be connected to a tenth connection electrode BE10 of the third metal layer MTL3 through a thirty-fourth contact hole CNT34, and the tenth connection electrode BE10 may be connected to the drain electrode DE2 of the second transistor ST2 of the third pixel SP3 through a thirty-fifth contact hole CNT35. The third data line DL3 may supply a data voltage to the second transistor ST2 of the third pixel SP3.

The vertical voltage line VVSL may be located in the first metal layer MTL1. The vertical voltage line VVSL may be located on the other side (e.g., the right side) of the third data line DL3. The vertical voltage line VVSL may be connected to the second voltage line VSL of the third metal layer MTL3 through an eighth contact hole CNT8. The vertical voltage line VVSL may supply a low potential voltage to the second voltage line VSL.

The second voltage line VSL may be located in the third metal layer MTL3. The second voltage line VSL may be located on the upper side of some others of the plurality of horizontal gate lines HGL. The second voltage line VSL may supply the low potential voltage received from the vertical voltage line VVSL to the third electrode of each of the first to third pixels SP1, SP2, and SP3. Here, the third electrode of each of the first to third pixels SP1, SP2, and SP3 may be located in a fourth metal layer on the third metal layer MTL3.

The pixel circuit of the first pixel SP1 may include first to third transistors ST1, ST2, and ST3. The first transistor ST1 of the first pixel SP1 may include an active region ACT1, a gate electrode GE1, a drain electrode DE1, and a source electrode SE1. The active region ACT1 of the first transistor ST1 may be located on the active layer ACTL, and may overlap the gate electrode GE1 of the first transistor ST1 in the thickness direction (Z-axis direction). The active layer ACTL may be located on a buffer layer BF covering the first metal layer MTL1.

The gate electrode GE1 of the first transistor ST1 may be located in the second metal layer MTL2. The gate electrode GE1 of the first transistor ST1 may be a part of the first capacitor electrode CPE1 of the first capacitor C1. The first capacitor electrode CPE1 may be connected to a source electrode SE2 of the second transistor ST2 of the active layer ACTL through a sixteenth contact hole CNT16.

The drain electrode DE1 and the source electrode SE1 of the first transistor ST1 may be made conductive by heat treatment of the active layer ACTL. The drain electrode DE1 of the first transistor ST1 may be connected to the first voltage line VDL through the first connection electrode BE1. The drain electrode DE1 of the first transistor ST1 may receive the driving voltage from the first voltage line VDL.

The source electrode SE1 of the first transistor ST1 may be connected to a fourth connection electrode BE4 of the third metal layer MTL3 through a twelfth contact hole CNT12. The fourth connection electrode BE4 may be connected to a second capacitor electrode CPE2 of the first metal layer MTL1 through a thirteenth contact hole CNT13. Accordingly, the first capacitor C1 may be formed doubly (e.g., may have two upper plates) between the first capacitor electrode CPE1 and the second capacitor electrode CPE2, and between the first capacitor electrode CPE1 and the fourth connection electrode BE4.

The fourth connection electrode BE4 may be connected to a source electrode SE3 of the third transistor ST3 through a nineteenth contact hole CNT19. The fourth connection electrode BE4 may be connected to the first electrode of the first pixel SP1. Here, the first electrode of the first pixel SP1 may be located in the fourth metal layer.

The second transistor ST2 of the first pixel SP1 may include an active region ACT2, a gate electrode GE2, a drain electrode DE2, and a source electrode SE2. The active region ACT2 of the second transistor ST2 may be located on the active layer ACTL, and may overlap the gate electrode GE2 of the second transistor ST2 in the thickness direction (Z-axis direction).

The gate electrode GE2 of the second transistor ST2 may be located in the second metal layer MTL2. The gate electrode GE2 of the second transistor ST2 may be a part of the auxiliary gate line BGL.

The drain electrode DE2 and the source electrode SE2 of the second transistor ST2 may be made conductive by heat treatment of the active layer ACTL. The drain electrode DE2 of the second transistor ST2 may be directly connected to the first data line DL1 through the second connection electrode BE2. The drain electrode DE2 of the second transistor ST2 may receive the data voltage of the first pixel SP1 from the first data line DL1.

The source electrode SE2 of the second transistor ST2 may be connected to the gate electrode GE1 of the first transistor ST1 by being connected to the first capacitor electrode CPE1 through a sixteenth contact hole CNT16.

The third transistor ST3 of the first pixel SP1 may include an active region ACT3, a gate electrode GE3, a drain electrode DE3, and a source electrode SE3. The active region ACT3 of the third transistor ST3 may be located on the active layer ACTL, and may overlap the gate electrode GE3 of the third transistor ST3 in the thickness direction (Z-axis direction).

The gate electrode GE3 of the third transistor ST3 may be located in the second metal layer MTL2. The gate electrode GE3 of the third transistor ST3 may be a part of the auxiliary gate line BGL.

The drain electrode DE3 and the source electrode SE3 of the third transistor ST3 may be made conductive by heat treatment of the active layer ACTL. The drain electrode DE3 of the third transistor ST3 may be connected to the initialization voltage line VIL through the third connection electrode BE3. The drain electrode DE3 of the third transistor ST3 may receive the initialization voltage from the initialization voltage line VIL. The drain electrode DE3 of the third transistor ST3 may supply the sensing signal to the initialization voltage line VIL.

The source electrode SE3 of the third transistor ST3 may be connected to the fourth connection electrode BE4 through a nineteenth contact hole CNT19. The fourth connection electrode BE4 may be connected to the source electrode SE1 of the first transistor ST1 through the twelfth contact hole CNT12, and may be connected to the second capacitor electrode CPE2 of the first metal layer MTL1 through the thirteenth contact hole CNT13.

The pixel circuit of the second pixel SP2 may include first to third transistors ST1, ST2, and ST3. The first transistor ST1 of the second pixel SP2 may include an active region ACT1, a gate electrode GE1, a drain electrode DE1, and a source electrode SE1. The active region ACT1 of the first transistor ST1 may be located on the active layer ACTL, and may overlap the gate electrode GE1 of the first transistor ST1 in the thickness direction (Z-axis direction).

The gate electrode GE1 of the first transistor ST1 may be located in the second metal layer MTL2. The gate electrode GE1 of the first transistor ST1 may be a part of the first capacitor electrode CPE1 of the first capacitor C1. The first capacitor electrode CPE1 may be connected to the source electrode SE2 of the second transistor ST2 of the active layer ACTL through a twenty-sixth contact hole CNT26.

The drain electrode DE1 and the source electrode SE1 of the first transistor ST1 may be made conductive by heat treatment of the active layer. The drain electrode DE1 of the first transistor ST1 may be connected to the first voltage line VDL through the fifth connection electrode BE5. The drain electrode DE1 of the first transistor ST1 may receive the driving voltage from the first voltage line VDL.

The source electrode SE1 of the first transistor ST1 may be connected to an eighth connection electrode BE8 of the third metal layer MTL3 through a twenty-second contact hole CNT22. The eighth connection electrode BE8 may be connected to the second capacitor electrode CPE2 of the first metal layer MTL1 through a twenty-third contact hole CNT23. Accordingly, the first capacitor C1 may be formed doubly between the first capacitor electrode CPE1 and the second capacitor electrode CPE2, and between the first capacitor electrode CPE1 and the eighth connection electrode BE8.

The eighth connection electrode BE8 may be connected to the source electrode SE3 of the third transistor ST3 through the twenty-ninth contact hole CNT29. The eighth connection electrode BE8 may be connected to the first electrode of the second pixel SP2. Here, the first electrode of the second pixel SP2 may be located in the fourth metal layer.

The second transistor ST2 of the second pixel SP2 may include an active region ACT2, a gate electrode GE2, a drain electrode DE2, and a source electrode SE2. The active region ACT2 of the second transistor ST2 may be located on the active layer ACTL, and may overlap the gate electrode GE2 of the second transistor ST2 in the thickness direction (Z-axis direction).

The gate electrode GE2 of the second transistor ST2 may be located in the second metal layer MTL2. The gate electrode GE2 of the second transistor ST2 may be a part of the auxiliary gate line BGL.

The drain electrode DE2 and the source electrode SE2 of the second transistor ST2 may be made conductive by heat treatment of the active layer ACTL. The drain electrode DE2 of the second transistor ST2 may be connected to the second data line DL2 through the sixth connection electrode BE6. The drain electrode DE2 of the second transistor ST2 may receive the data voltage of the second pixel SP2 from the second data line DL2.

The source electrode SE2 of the second transistor ST2 may be connected to the gate electrode GE1 of the first transistor ST1 by being connected to the first capacitor electrode CPE1 through the twenty-sixth contact hole CNT26.

The third transistor ST3 of the second pixel SP2 may include an active region ACT3, a gate electrode GE3, a drain electrode DE3, and a source electrode SE3. The active region ACT3 of the third transistor ST3 may be located on the active layer ACTL, and may overlap the gate electrode GE3 of the third transistor ST3 in the thickness direction (Z-axis direction).

The gate electrode GE3 of the third transistor ST3 may be located in the second metal layer MTL2. The gate electrode GE3 of the third transistor ST3 may be a part of the auxiliary gate line BGL.

The drain electrode DE3 and the source electrode SE3 of the third transistor ST3 may be made conductive by heat treatment of the active layer ACTL. The drain electrode DE3 of the third transistor ST3 may be connected to the initialization voltage line VIL through the seventh connection electrode BE7. The drain electrode DE3 of the third transistor ST3 may receive the initialization voltage from the initialization voltage line VIL. The drain electrode DE3 of the third transistor ST3 may supply the sensing signal to the initialization voltage line VIL.

The source electrode SE3 of the third transistor ST3 may be connected to the eighth connection electrode BE8 through the twenty-ninth contact hole CNT29. The eighth connection electrode BE8 may be connected to the source electrode SE1 of the first transistor ST1 through the twenty-second contact hole CNT22, and may be connected to the second capacitor electrode CPE2 of the first metal layer MTL1 through the twenty-third contact hole CNT23.

The pixel circuit of the third pixel SP3 may include first to third transistors ST1, ST2, and ST3. The first transistor ST1 of the third pixel SP3 may include an active region ACT1, a gate electrode GE1, a drain electrode DE1, and a source electrode SE1. The active region ACT1 of the first transistor ST1 may be located on the active layer ACTL, and may overlap the gate electrode GE1 of the first transistor ST1 in the thickness direction (Z-axis direction).

The gate electrode GE1 of the first transistor ST1 may be located in the second metal layer MTL2. The gate electrode GE1 of the first transistor ST1 may be a part of the first capacitor electrode CPE1 of the first capacitor C1. The first capacitor electrode CPE1 may be connected to the source electrode SE2 of the second transistor ST2 of the active layer ACTL through a thirty-sixth contact hole CNT36.

The drain electrode DE1 and the source electrode SE1 of the first transistor ST1 may be made conductive by heat treatment of the active layer. The drain electrode DE1 of the first transistor ST1 may be connected to the first voltage line VDL through the ninth connection electrode BE9. The drain electrode DE1 of the first transistor ST1 may receive the driving voltage from the first voltage line VDL.

The source electrode SE1 of the first transistor ST1 may be connected to a twelfth connection electrode BE12 of the third metal layer MTL3 through a thirty-second contact hole CNT32. The twelfth connection electrode BE12 may be connected to the second capacitor electrode CPE2 of the first metal layer MTL1 through a thirty-third contact hole CNT33. Accordingly, the first capacitor C1 may be formed doubly between the first capacitor electrode CPE1 and the second capacitor electrode CPE2, and between the first capacitor electrode CPE1 and the twelfth connection electrode BE12.

The twelfth connection electrode BE12 may be connected to the source electrode SE3 of the third transistor ST3 through a thirty-ninth contact hole CNT39. The twelfth connection electrode BE12 may be connected to the first electrode of the third pixel SP3. Here, the first electrode of the third pixel SP3 may be located in the fourth metal layer.

The second transistor ST2 of the third pixel SP3 may include an active region ACT2, a gate electrode GE2, a drain electrode DE2, and a source electrode SE2. The active region ACT2 of the second transistor ST2 may be located on the active layer ACTL, and may overlap the gate electrode GE2 of the second transistor ST2 in the thickness direction (Z-axis direction).

The gate electrode GE2 of the second transistor ST2 may be located in the second metal layer MTL2. The gate electrode GE2 of the second transistor ST2 may be a part of the auxiliary gate line BGL.

The drain electrode DE2 and the source electrode SE2 of the second transistor ST2 may be made conductive by heat treatment of the active layer ACTL. The drain electrode DE2 of the second transistor ST2 may be connected to the third data line DL3 through the tenth connection electrode BE10. The drain electrode DE2 of the second transistor ST2 may receive the data voltage of the third pixel SP3 from the third data line DL3.

The source electrode SE2 of the second transistor ST2 may be connected to the gate electrode GE1 of the first transistor ST1 by being connected to the first capacitor electrode CPE1 through the thirty-sixth contact hole CNT36.

The third transistor ST3 of the third pixel SP3 may include an active region ACT3, a gate electrode GE3, a drain electrode DE3, and a source electrode SE3. The active region ACT3 of the third transistor ST3 may be located on the active layer ACTL and may overlap the gate electrode GE3 of the third transistor ST3 in the thickness direction (Z-axis direction).

The gate electrode GE3 of the third transistor ST3 may be located in the second metal layer MTL2. The gate electrode GE3 of the third transistor ST3 may be a part of the auxiliary gate line BGL.

The drain electrode DE3 and the source electrode SE3 of the third transistor ST3 may be made conductive by heat treatment of the active layer ACTL. The drain electrode DE3 of the third transistor ST3 may be connected to the initialization voltage line VIL through the eleventh connection electrode BE11. The drain electrode DE3 of the third transistor ST3 may receive the initialization voltage from the initialization voltage line VIL. The drain electrode DE3 of the third transistor ST3 may supply the sensing signal to the initialization voltage line VIL.

The source electrode SE3 of the third transistor ST3 may be connected to the twelfth connection electrode BE12 through the thirty-ninth contact hole CNT39. The twelfth connection electrode BE12 may be connected to the source electrode SE1 of the first transistor ST1 through the thirty-second contact hole CNT32, and may be connected to the second capacitor electrode CPE2 of the first metal layer MTL1 through the thirty-third contact hole CNT33.

Figure 10:
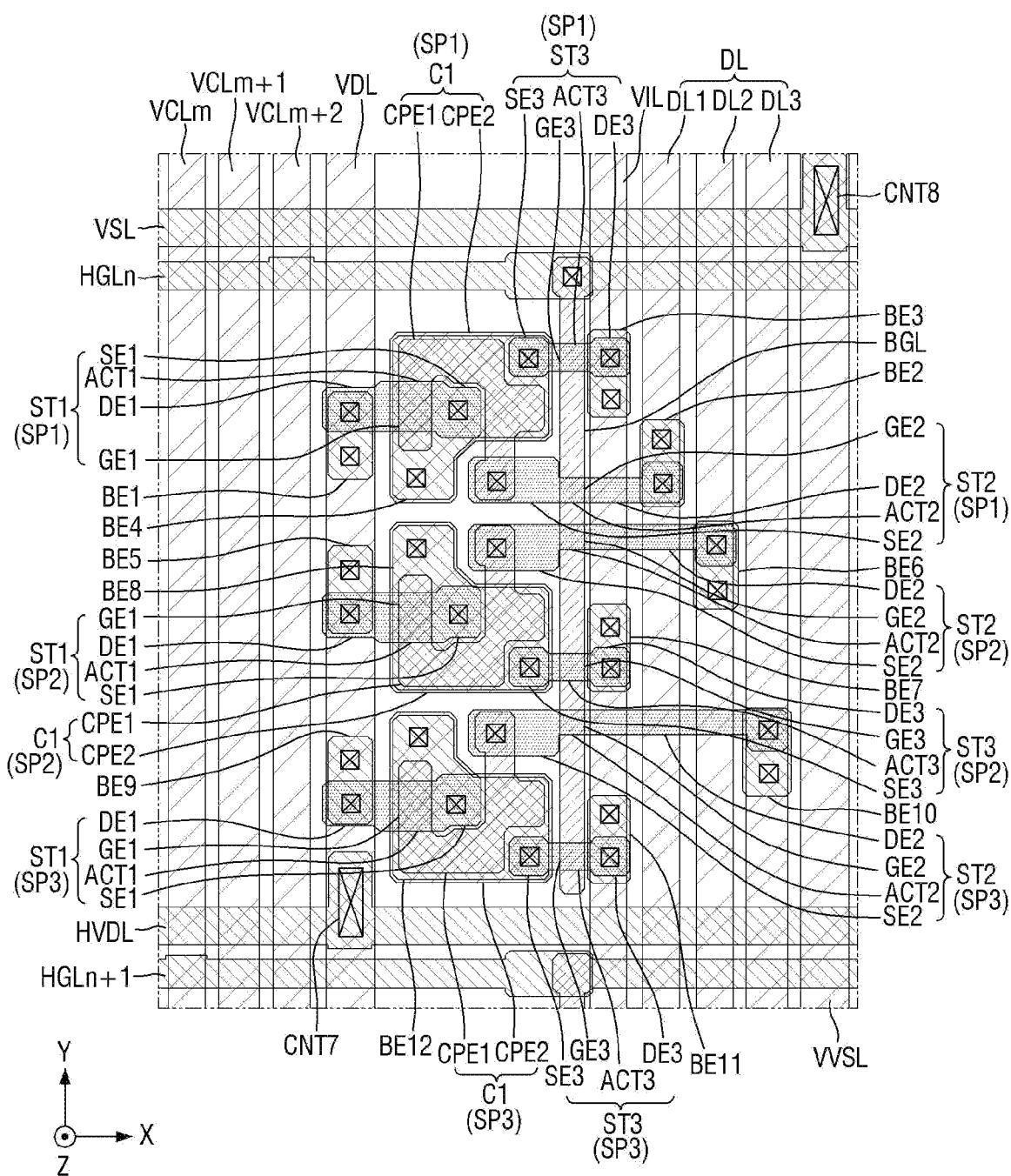
FIG. 10 is a plan view illustrating a unit pixel adjacent to a vertical connection line in a display device according to one or more embodiments.

FIG. 10 is a plan view illustrating a unit pixel adjacent to a vertical connection line in a display device according to one or more embodiments. The unit pixel UP of FIG. 10 may be located in the first sub-display area SDA1. The display device of FIG. 10 has a different configuration of the vertical connection line VCL from the display devices of FIGS. 7 and 8, and the same configuration as the aforementioned configuration will be briefly described or not repeated.

Referring to FIG. 10, the display area DA may include the unit pixel UP, the first voltage line VDL, the horizontal voltage line HVDL, the vertical connection line VCL, the horizontal gate line HGL, the auxiliary gate line BGL, the initialization voltage line VIL, the data line DL, the vertical voltage line WVSL, and the second voltage line VSL.

The vertical connection line VCL may be located in the first metal layer MTL1. The vertical connection line VCL may include an $m^{th}$ vertical connection line VCLm (m being a positive integer), an $(m+1)^{th}$ vertical connection line VCLm+1, and an $(m+2)^{th}$ vertical connection line VCLm+2 located on one side (e.g., the left side) of the first voltage line VDL. Each of the plurality of vertical connection lines VCL may be connected to the power line VL and the data line DL of the second or third sub-display area SDA2 or SDA3 through the corresponding horizontal connection line HCL.

Accordingly, the plurality of vertical gate lines VGL may be located on one side (e.g., the left side) of some of the unit pixels UP of the first sub-display area SDA1, and the plurality of vertical connection lines VCL may be located on one side (e.g., the left side) of some others of the unit pixels UP of the first sub-display area SDA1. The vertical gate line VGL and the vertical connection line VCL may have patterns of the same shape in the first metal layer MTL1, but are not limited thereto. For example, among the patterns of the first metal layer MTL1 located on one side (e.g., the left side) of the unit pixel UP, a pattern connected to the horizontal gate line HGL may correspond to the vertical gate line VGL, and among the patterns of the first metal layer MTL1 located on one side (e.g., the left side) of the unit pixel UP, a pattern connected to the horizontal connection line HCL may correspond to the vertical connection line VCL. The display panel 100 may reduce or minimize the size of the upper side of the non-display area NDA by electrically connecting the pad portion PAD to the second or third sub-display area SDA2 or SDA3 through the connection line CL passing through the first sub-display area SDA1.

Figure 11:
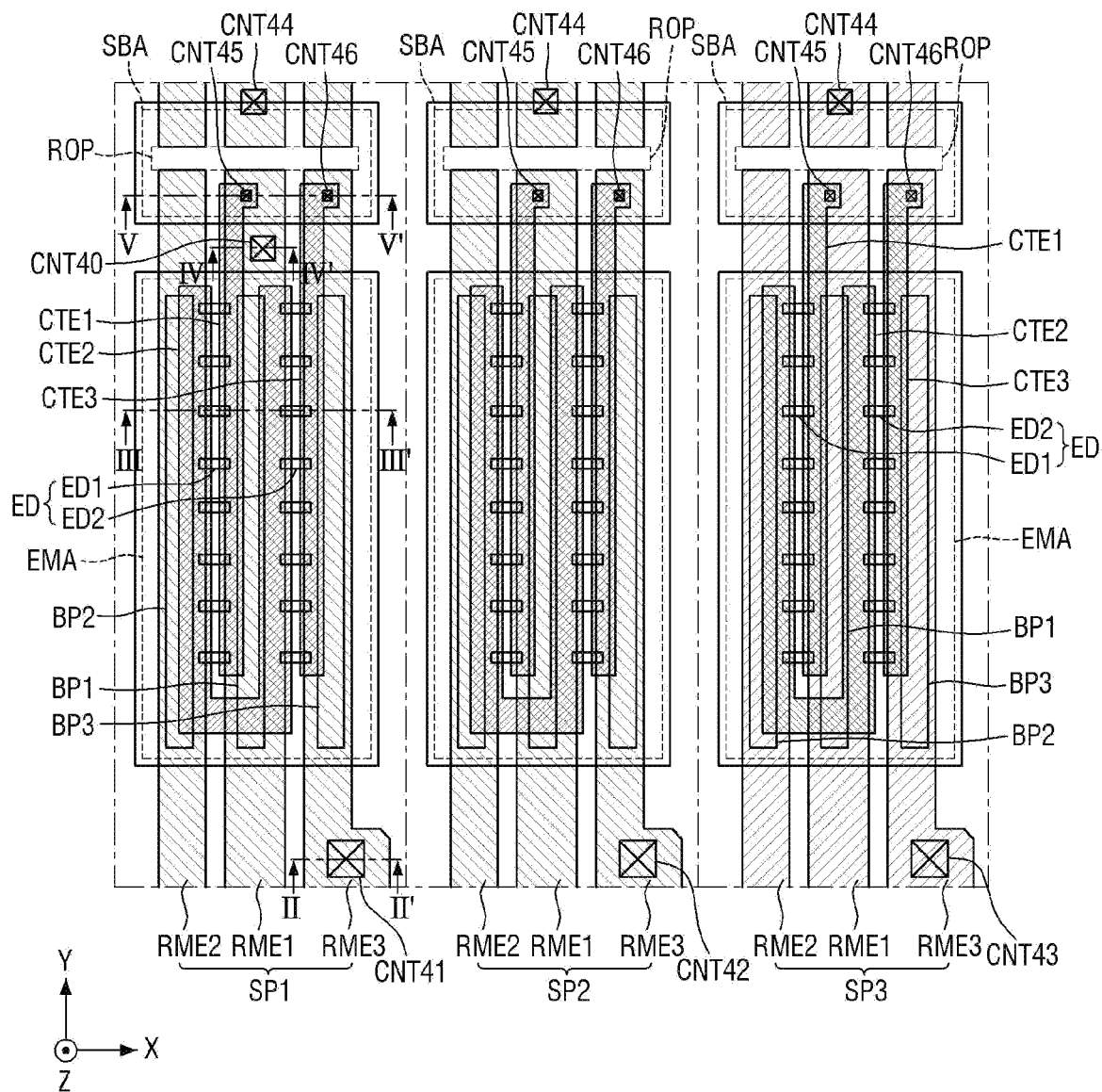
FIG. 11 is a plan view illustrating a light emitting element layer of a display device according to one or more embodiments.
Figure 12:
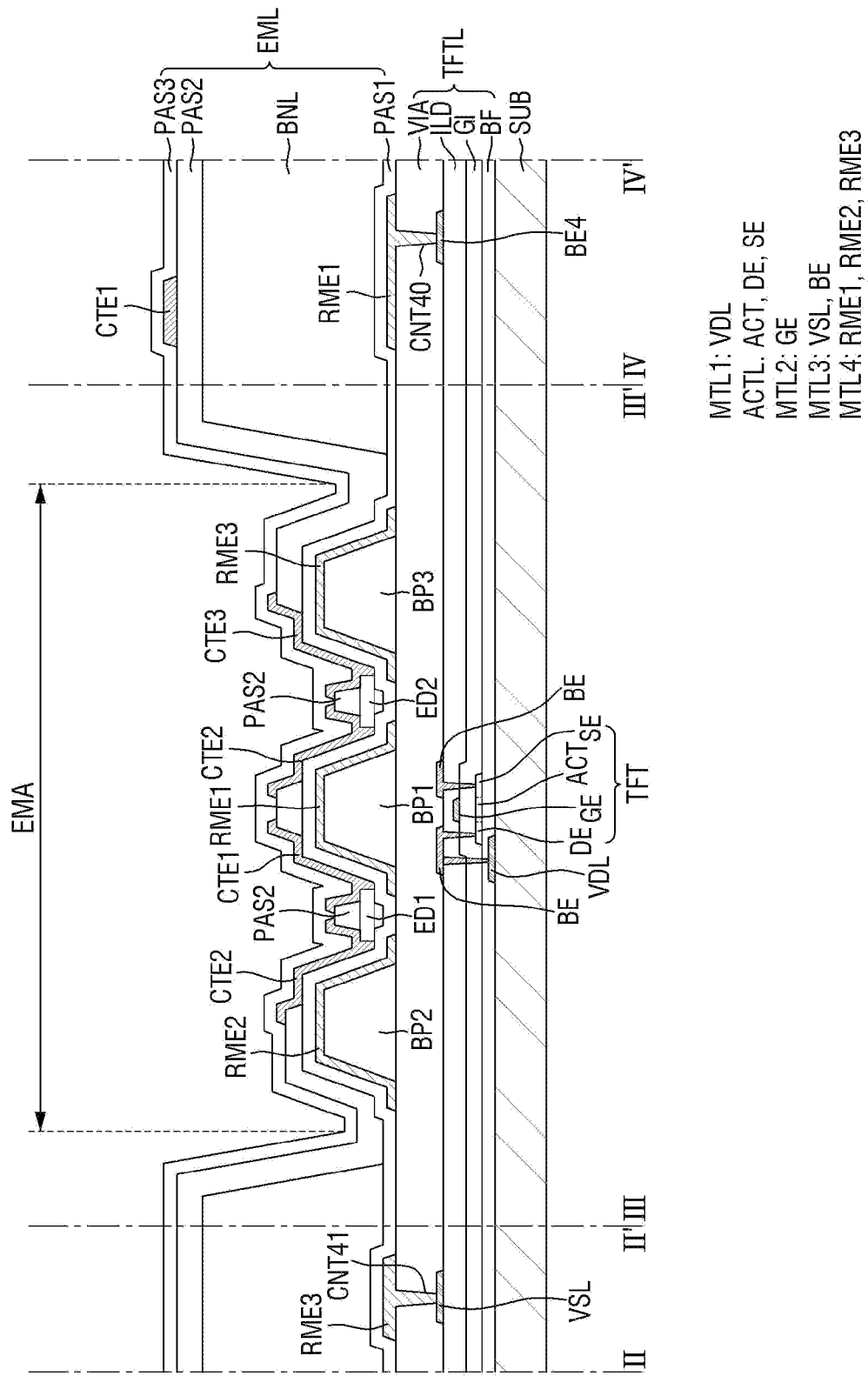
FIG. 12 is a cross-sectional view taken along the lines II-II', III-III', and IV-IV''' of FIG. 11.
Figure 13:
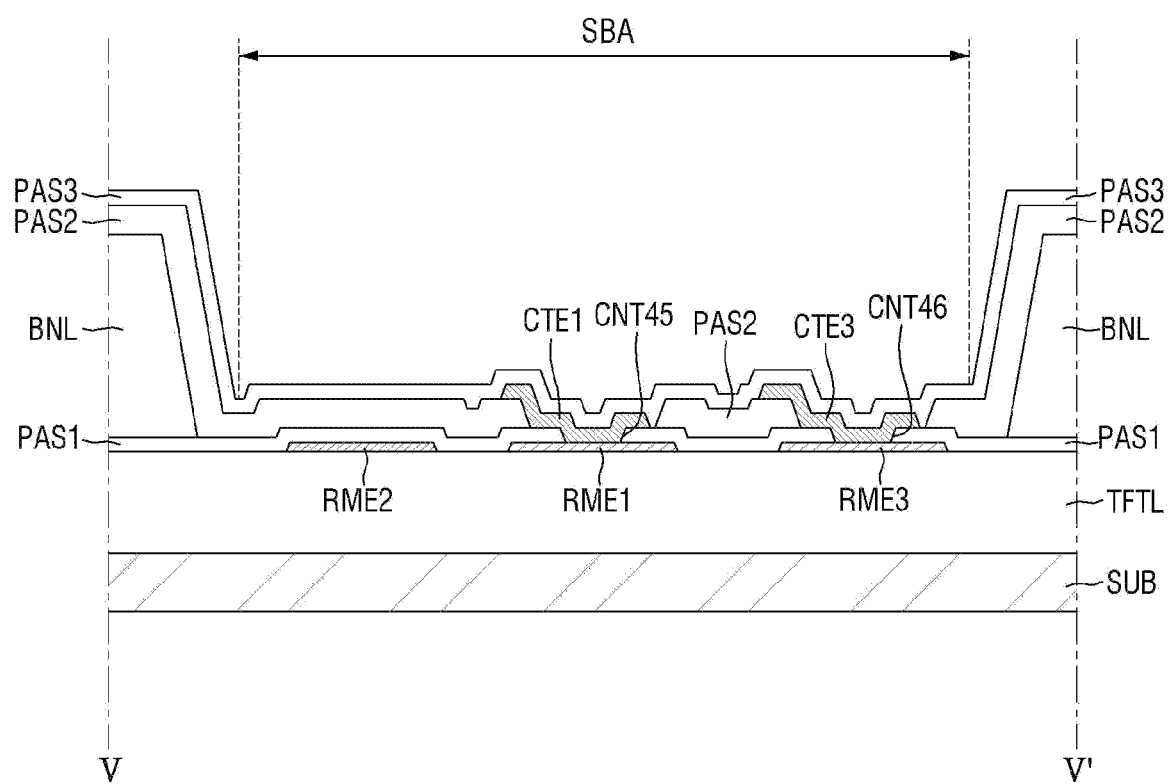
FIG. 13 is a cross-sectional view taken along the line V-V' of FIG. 11.

FIG. 11 is a plan view illustrating a light emitting element layer of a display device according to one or more embodiments. FIG. 12 is a cross-sectional view taken along the lines II-II', III-III', and IV-IV of FIG. 11. FIG. 13 is a cross-sectional view taken along the line V-V' of FIG. 11.

Referring to FIGS. 11 to 13, a thin film transistor layer TFTL may include the first voltage line VDL, a thin film transistor TFT, the connection electrode BE, the second voltage line VSL, and the fourth connection electrode BE. The first voltage line VDL may be located in a first metal layer MTL1 on the substrate SUB. The active region ACT, the drain electrode DE, and the source electrode SE of the thin film transistor TFT may be located in the active layer ACTL on the buffer layer BF. The gate electrode GE of the thin film transistor TFT may be located in the second metal layer MTL2 on the gate insulating layer GI. The second voltage line VSL, the connection electrode BE, and the fourth connection electrode BE4 may be located in the third metal layer MTL3 on the interlayer insulating layer ILD.

The light emitting element layer EML of the display device 10 may be located on the thin film transistor layer TFTL. The light emitting element layer EML may include first to third bank patterns BP1, BP2, and BP3, first to third electrodes RME1, RME2, and RME3, the first and second light emitting elements ED1 and ED2, a first insulating layer PAS1, a bank layer BNL, a second insulating layer PAS2, first to third contact electrodes CTE1, CTE2, and CTE3, and a third insulating layer PAS3.

The first bank pattern BP1 may be located in the center of an emission area EMA, the second bank pattern BP2 may be located on the left side of the emission area EMA, and the third bank pattern BP3 may be located on the right side of the emission area EMA. Each of the first to third bank patterns BP1, BP2, and BP3 may protrude in the upward direction (Z-axis direction) on a via layer VIA. Each of the first to third bank patterns BP1, BP2, and BP3 may have an inclined side surface. The plurality of first light emitting elements ED1 may be located between the first and second bank patterns BP1 and BP2 spaced apart from each other, and the plurality of second light emitting elements ED2 may be located between the second and third bank patterns BP2 and BP3 spaced apart from each other. The first to third bank patterns BP1, BP2, and BP3 may have the same length in the second direction (Y-axis direction) and different lengths in the first direction (X-axis direction), but are not limited thereto. The first to third bank patterns BP1, BP2, and BP3 may be located in island-like patterns on the entire surface of the display area DA.

The first to third electrodes RME1, RME2, and RME3 of each of the first to third pixels SP1, SP2, and SP3 may be located in the fourth metal layer MTL4. The fourth metal layer MTL4 may be located on the via layer VIA and the first to third bank patterns BP1, BP2, and BP3. The first electrode RME1 may extend in the second direction (Y-axis direction) from the center of the emission area EMA. The first electrode RME1 may cover a top surface and an inclined side surface of the first bank pattern BP1. Accordingly, the first electrode RME1 may reflect the light emitted from the first and second light emitting elements ED1 and ED2 in the upward direction (Z-axis direction).

The second electrode RME2 may extend in the second direction (Y-axis direction) from the left side of the emission area EMA. The second electrode RME2 may cover a top surface and an inclined side surface of the second bank pattern BP2. Accordingly, the second electrode RME2 may reflect the light emitted from the first light emitting element ED1 in the upward direction (Z-axis direction).

The third electrode RME3 may extend in the second direction (Y-axis direction) from the right side of the emission area EMA. The third electrode RME3 may cover the top surface and the inclined side surface of the third bank pattern BP3. Accordingly, the third electrode RME3 may reflect the light emitted from the second light emitting element ED2 in the upward direction (Z-axis direction).

Respective ends of the first to third electrodes RME1, RME2, and RME3 may be separated on a row basis by the separation portion ROP. The first to third electrodes RME1, RME2, and RME3 may be alignment electrodes that align the first and second light emitting elements ED1 and ED2 during the manufacturing process of the display device 10. The first electrode RME1 before separation may be connected to the horizontal voltage line HVDL of the third metal layer MTL3 through a forty-fourth contact hole CNT44, and may receive a driving voltage or a high potential voltage to function as the alignment electrode. Accordingly, the first to third electrodes RME1, RME2, and RME3 may be separated by the separation portion ROP after the alignment process of the plurality of light emitting elements ED is completed.

The first electrode RME1 of the first pixel SP1 may be connected to the fourth connection electrode BE4 of the third metal layer MTL3 through a fortieth contact hole CNT40. The first electrode RME1 may receive the driving current having passed through the first transistor ST1 from the fourth connection electrode BE4. The first electrode RME1 may supply a driving current to the plurality of first light emitting elements ED1 of the first pixel SP1 through the first contact electrode CTE1.

The third electrode RME3 of the first pixel SP1 may be connected to the second voltage line VSL of the third metal layer MTL3 through a forty-first contact hole CNT41. Accordingly, the third electrode RME3 of the first pixel SP1 may receive a low potential voltage from the second voltage line VSL.

The third electrode RME3 of the second pixel SP2 may be connected to the second voltage line VSL of the third metal layer MTL3 through a forty-second contact hole CNT42. Accordingly, the third electrode RME3 of the second pixel SP2 may receive a low potential voltage from the second voltage line VSL.

The third electrode RME3 of the third pixel SP3 may be connected to the second voltage line VSL of the third metal layer MTL3 through a forty-third contact hole CNT43. Accordingly, the third electrode RME3 of the third pixel SP3 may receive a low potential voltage from the second voltage line VSL.

A plurality of first light emitting elements ED1 may be aligned between the first electrode RME1 and the second electrode RME2. The first insulating layer PAS1 may cover the first to third electrodes RME1, RME2, and RME3. The first light emitting elements ED1 may be insulated from the first and second electrodes RME1 and RME2 by the first insulating layer PAS1. Before the first and second electrode RME1 and RME2 are separated by the separation portion ROP, each of the first and second electrodes RME1 and RME2 may receive the alignment signal, and the electric field may be formed between the first and second electrodes RME1 and RME2. For example, the plurality of first light emitting elements ED1 may be sprayed on the first and second electrodes RME1 and RME2 through an inkjet printing process, and the plurality of first light emitting elements ED1 dispersed in ink may be aligned by a dielectrophoretic force due to the electric field formed between the first and second electrodes RME1 and RME2. Accordingly, the plurality of first light emitting elements ED1 may be aligned in the second direction (Y-axis direction) between the first and second electrodes RME1 and RME2.

A plurality of second light emitting elements ED2 may be aligned between the first electrode RME1 and the third electrode RME3. The second light emitting elements ED2 may be insulated from the first and third electrodes RME1 and RME3 by the first insulating layer PAS1. Before the first and third electrode RME1 and RME3 are separated by the separation portion ROP, each of the first and third electrode RME1 and RME3 may receive the alignment signal, and the electric field may be formed between the first and third electrode RME1 and RME3. For example, the plurality of second light emitting elements ED2 may be sprayed on the first and third electrodes RME1 and RME3 through the inkjet printing process, and the plurality of second light emitting elements ED2 sprayed in ink may be aligned by receiving a dielectrophoretic force by the electric field formed between the first and third electrodes RME1 and RME3. Accordingly, the plurality of second light emitting elements ED2 may be aligned in the second direction (Y-axis direction) between the first and third electrodes RME1 and RME3.

The first to third contact electrodes CTE1, CTE2, and CTE3 of each of the first to third pixels SP1, SP2, and SP3 may be located on the first to third electrodes RME1, RME2, and RME3. The second insulating layer PAS2 may be located on the bank layer BNL, the first insulating layer PAS1, and the central portions of the light emitting elements ED. The third insulating layer PAS3 may cover the second insulating layer PAS2 and the first to third contact electrodes CTE1, CTE2, and CTE3. The second and third insulating layers PAS2 may insulate each of the first to third contact electrodes CTE1, CTE2, and CTE3.

The first contact electrode CTE1 may be located on the first electrode RME1, and connected to the first electrode RME1 through a forty-fifth contact hole CNT45. The first contact electrode CTE1 may be connected between the first electrode RME1 and respective ends of the plurality of first light emitting elements ED1. The first contact electrode CTE1 may correspond to an anode electrode of the plurality of first light emitting elements ED1, but the present disclosure is not limited thereto.

The second contact electrode CTE2 may be located on the first and second electrodes RME1 and RME2, and may be insulated from the first and second electrodes RME1 and RME2. The first portion of the second contact electrode CTE2 may be located on the second electrode RME2, and may extend in the second direction (Y-axis direction). The second portion of the second contact electrode CTE2 may be bent from the lower side of the first portion thereof to extend in the first direction (X-axis direction). The third portion of the second contact electrode CTE2 may be bent from the right side of the second portion thereof to extend in the second direction (Y-axis direction), and may be located on the first electrode RME1.

The second contact electrode CTE2 may be connected between the other respective ends of the plurality of first light emitting elements ED1 and respective ends of the plurality of second light emitting elements ED2. The second contact electrode CTE2 may correspond to the third node N3 of FIG. 4. The second contact electrode CTE2 may correspond to a cathode electrode of the plurality of first light emitting elements ED1, but is not limited thereto. The second contact electrode CTE2 may correspond to an anode electrode of the plurality of second light emitting elements ED2, but is not limited thereto.

The third contact electrode CTE3 may be located on the third electrode RME3, and may be connected to the third electrode RME3 through a forty-sixth contact hole CNT46. The third contact electrode CTE3 may be connected between the other ends of the plurality of second light emitting elements ED2 and the third electrode RME3. The third contact electrode CTE3 may correspond to a cathode electrode of the plurality of second light emitting elements ED2, but is not limited thereto. The third contact electrode CTE3 may receive the low potential voltage through the third electrode RME3.

What is claimed is:

1. A display device comprising a display panel comprising a display area having unit pixels, and a non-display area surrounding the display area in plan view, and having a pad portion at one side of the non-display area, wherein the display area comprises:
   a first sub-display area overlapping the pad portion in a second direction; and
   a second sub-display area at one side of the first sub-display area, and comprising a second data line,
   wherein the first sub-display area comprises:
      a first data line connected to the pad portion, and extending in the second direction;
      a first gate line connected to the pad portion, extending in the second direction, and located on one side of some of the unit pixels;
      a first connection line connected to the pad portion, extending in the second direction, and located on one side of others of the unit pixels; and
      a second connection line connected to the first connection line, and extending to the second sub-display area in a first direction crossing the second direction, and wherein the second data line is electrically connected to the pad portion through the first connection line and the second connection line.

2. The display device of claim 1, wherein the first connection line extends from a first side of the first sub-display area facing the pad portion to a second side of the first sub-display area that is opposite to the first side.

3. The display device of claim 1, wherein the second sub-display area further comprises a dummy scan line extending in the second direction, and located on one side of the unit pixels.

4. The display device of claim 3, wherein the dummy scan line, the first gate line, and the first connection line have patterns of a same shape.

5. The display device of claim 3, wherein the first sub-display area further comprises a power line connected to the pad portion, and extending in the second direction, and
   wherein the second sub-display area further comprises another power line electrically connected to the pad portion through another first connection line and another second connection line.

6. The display device of claim 5, wherein the power line of the first sub-display area comprises:
   a first voltage line configured to supply a high potential voltage to the unit pixels;
   an initialization voltage line configured to supply an initialization voltage to the unit pixels; and
   a vertical voltage line configured to receive a low potential voltage from the pad portion.

7. The display device of claim 6, wherein the first voltage line is between the some of the unit pixels and the first gate line.

8. The display device of claim 6, wherein the first voltage line is between the some of the unit pixels and the first connection line.

9. The display device of claim 6, wherein the dummy scan line is electrically connected to the first voltage line or the vertical voltage line.

10. The display device of claim 5, wherein each of the first and second sub-display areas further comprises a voltage connection line connected to the power line and extending in the first direction.

11. The display device of claim 10, wherein the second connection line and the voltage connection line are on a same imaginary extension line.

12. The display device of claim 1, wherein the first sub-display area further comprises a second gate line connected to the first gate line, and extending to the second sub-display area in the first direction.

13. The display device of claim 12, wherein respective contact portions of first gate lines comprising the first gate line and second gate lines comprising the second gate line are on a same extension line extending from a lower end of one side of the first sub-display area to an upper end of another side of the first sub-display area.

14. A display device comprising:
   a pad portion;
   a first sub-display area overlapping the pad portion in a second direction; and
   a second sub-display area on one side of the first sub-display area,
   wherein the first sub-display area comprises:
      a data line connected to the pad portion, and extending in the second direction;
      a first voltage line connected to the pad portion, and extending in the second direction;

a first gate line connected to the pad portion, and located on one side of some of the first voltage lines;

a first connection line connected to the pad portion, and located on one side of others of the first voltage lines; and a second connection line connected to the first connection line, and extending to the second sub-display area in a first direction crossing the second direction, and wherein the second sub-display area comprises:

another first voltage line electrically connected to the pad portion through the first connection line and the second connection line; and a dummy scan line on one side of the another first voltage line.

15. The display device of claim 14, wherein the dummy scan line, the first gate line, and the first connection line have patterns of a same shape.

16. The display device of claim 14, wherein the second sub-display area further comprises another data line electrically connected to the pad portion through another first connection line and another second connection line.

17. The display device of claim 14, wherein the first sub-display area further comprises a second gate line connected to the first gate line, and extending to the second sub-display area in the first direction.

18. The display device of claim 17, wherein each of the first and second sub-display areas further comprises an auxiliary gate line protruding from the second gate line in the second direction.

19. The display device of claim 18, wherein the first gate line, the first connection line, and the data line are in a first metal layer, wherein the auxiliary gate line is in a second metal layer on the first metal layer, and wherein the second gate line and the second connection line are in a third metal layer on the second metal layer.

20. The display device of claim 14, wherein the first sub-display area further comprises a horizontal voltage line connected to the first voltage line, extending in the first direction, and being on a same imaginary extension line as the second connection line.

* * * * *